United States Patent
An et al.

(10) Patent No.: US 10,593,268 B2
(45) Date of Patent: Mar. 17, 2020

(54) EXTERNAL COMPENSATION FOR A DISPLAY DEVICE AND METHOD OF DRIVING THE SAME

(71) Applicant: LG Display Co., Ltd., Seoul (KR)

(72) Inventors: Changho An, Hwaseong-si (KR); Byungil Kim, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 145 days.

(21) Appl. No.: 15/610,292

(22) Filed: May 31, 2017

(65) Prior Publication Data
US 2018/0137825 A1     May 17, 2018

(30) Foreign Application Priority Data
Nov. 17, 2016 (KR) .................. 10-2016-0153545

(51) Int. Cl.
    *G09G 3/32*       (2016.01)
    *G09G 3/3266*    (2016.01)
    (Continued)

(52) U.S. Cl.
CPC ......... *G09G 3/3266* (2013.01); *G09G 3/3233* (2013.01); *G09G 3/3291* (2013.01); *G11C 19/28* (2013.01); *G09G 2300/0842* (2013.01); *G09G 2310/027* (2013.01); *G09G 2310/0262* (2013.01); *G09G 2310/0286* (2013.01);
(Continued)

(58) Field of Classification Search
CPC ......... G09G 2330/04; G09G 2330/044; G09G 2330/08
See application file for complete search history.

(56) References Cited

U.S. PATENT DOCUMENTS

2002/0093478 A1*   7/2002   Yeh .................. G09G 5/18
                                               345/98
2016/0104425 A1*   4/2016   Kim ................ G09G 3/3233
                                               345/80
(Continued)

FOREIGN PATENT DOCUMENTS

| KR | 10-2014-0071734 A | 6/2014 |
|---|---|---|
| WO | WO 2015-190407 A1 | 4/2017 |

OTHER PUBLICATIONS

European Partial Search Report, European Application No. 17178409.3, Oct. 25, 2017, 22 pages.

*Primary Examiner* — Stephen G Sherman
*Assistant Examiner* — Nathaniel P Brittingham
(74) *Attorney, Agent, or Firm* — Fenwick & West LLP

(57) ABSTRACT

A display device comprises a display panel and a timing controller. Electrical characteristics of sensing target display lines of the display panel are sensed during the sensing periods of vertical active periods of sensing drive frames. Data lines are driven with data signals without sensing the display lines during the vertical active periods of normal drive frames and during display periods of the vertical active periods of the sensing drive frames. A timing controller supplies timing signals to a gate driver as a plurality of clock pulses to control timing of the gate driver providing gate pulses to the gate lines. The clock pulses have a first timing during the vertical active periods of the sensing drive frames and the clock pulses have a second timing during the vertical active periods of the normal drive frames in which the second timing is different than the first timing.

20 Claims, 19 Drawing Sheets

(51) Int. Cl.
*G09G 3/3233* (2016.01)
*G09G 3/3291* (2016.01)
*G11C 19/28* (2006.01)

(52) U.S. Cl.
CPC . *G09G 2310/0289* (2013.01); *G09G 2310/08* (2013.01); *G09G 2320/0285* (2013.01); *G09G 2320/0295* (2013.01); *G09G 2320/045* (2013.01); *G09G 2320/0646* (2013.01); *G09G 2320/0693* (2013.01)

(56) References Cited

U.S. PATENT DOCUMENTS

| | | | |
|---|---|---|---|
| 2016/0210900 A1* | 7/2016 | Kim | G09G 3/3233 |
| 2017/0148385 A1* | 5/2017 | Kishi | G09G 3/3225 |
| 2017/0186373 A1* | 6/2017 | Nishikawa | G11C 19/28 |
| 2018/0130423 A1* | 5/2018 | Kim | G09G 3/14 |
| 2018/0137825 A1* | 5/2018 | An | G09G 3/3266 |
| 2018/0151124 A1* | 5/2018 | An | G09G 3/3266 |
| 2019/0057978 A1* | 2/2019 | Kim | G09G 3/3258 |

* cited by examiner

EXTERNAL COMPENSATION FOR A DISPLAY DEVICE AND METHOD OF DRIVING THE SAME

This application claims the benefit of Korea Patent Application No. 10-2016-0153545 filed on Nov. 17, 2016, which is incorporated herein by reference for all purposes as if fully set forth herein.

BACKGROUND

Technical Field

The present disclosure relates to external compensation for a display device and a method of driving the same.

Discussion of the Related Art

Various types of panel displays have been developed and sold. Among the various types of panel displays, an electroluminescent display is classified into an inorganic electroluminescent display and an organic electroluminescent display depending on a material of an emission layer. In particular, an active matrix organic light emitting diode (OLED) display includes a plurality of OLEDs capable of emitting light by themselves and has many advantages, such as fast response time, high emission efficiency, high luminance, wide viewing angle, and the like.

An OLED serving as a self-emitting element includes an anode electrode, a cathode electrode, and an organic compound layer between the anode electrode and the cathode electrode. The organic compound layer includes a hole injection layer HIL, a hole transport layer HTL, an emission layer EML, an electron transport layer ETL, and an electron injection layer EIL. When power (voltage) is applied to the anode electrode and the cathode electrode, holes passing through the hole transport layer HTL and electrons passing through the electron transport layer ETL move to the emission layer EML and form excitons. As a result, the emission layer EML generates visible light.

An OLED display includes a plurality of pixels, each including an OLED and a thin film transistor (TFT) that adjusts a luminance of an image implemented on the pixels based on a grayscale of image data. The driving TFT controls a driving current flowing into the OLED depending on a voltage (hereinafter, referred to as "a gate-to-source voltage") between a gate electrode and a source electrode of the driving TFT. An amount of light emitted by the OLED is determined depending on the driving current of the OLED, and the luminance of the image is determined depending on the amount of light emitted by the OLED.

In general, when a driving TFT operates in a saturation region, a pixel current Ids flowing between a drain electrode and a source electrode of the driving TFT is expressed by the following Equation 1.

$$Ids = \tfrac{1}{2} * (\mu * C * W/L) * (Vgs - Vth)^2 \qquad \text{[Equation 1]}$$

In the above Equation 1, $\mu$ is electron mobility, C is a capacitance of a gate insulating layer, W is a channel width of the driving TFT, and L is a channel length of the driving TFT. In addition, Vgs is a voltage between a gate electrode and a source electrode of the driving TFT, and Vth is a threshold voltage (or a critical voltage) of the driving TFT. A gate-to-source voltage Vgs of the driving TFT may be a voltage differential between a data voltage and a reference voltage in accordance with a pixel structure. The data voltage is an analog voltage corresponding to a grayscale of image data, and the reference voltage is a fixed voltage. Therefore, the gate-to-source voltage Vgs of the driving TFT is programmed or set depending on the data voltage. Then, the pixel current Ids is determined depending on the programmed gate-to-source voltage Vgs.

Electrical characteristics of the pixel, such as the threshold voltage Vth and the electron mobility pt of the driving TFT and a threshold voltage of the OLED, may be factors determining an amount of pixel current Ids of the driving TFT. Therefore, all the pixels should have the same electrical characteristics. However, a variation in the electrical characteristics between the pixels may be caused by various factors such as manufacturing process characteristics and time-varying characteristics. The variation in the electrical characteristics between the pixels may lead to a luminance variation, and it is difficult to implement desired images or meet image quality requirements.

In order to compensate for the luminance variation between the pixels, there are so-called external compensation techniques for sensing electrical characteristics of the pixels and correcting (or compensating for) an input image based on the sensing result. In order to compensate for the luminance variation, a current change by an amount of Δy has to be ensured when the data voltage applied to the pixel is changed by an amount of "Δx". Thus, the external compensation technique is to implement the same (or effectively the same) brightness by calculating "Δx" for each pixel and applying the same pixel current to the OLED. Namely, the external compensation technique may be implemented to adjust the gray levels so that the pixels have the same or effectively the same brightness.

The electrical characteristics of the pixels may continuously change during the driving of the pixels. Thus, a real-time compensation technique for compensating for changes in the electrical characteristics of each pixel in real time may be needed to increase an external compensation performance.

In order to implement such real-time compensation techniques, a method has been proposed to perform a sensing drive operation in a vertical blanking interval, in which input image data is not written. The vertical blanking interval is disposed between every adjacent vertical active period in which input image data is written in one frame. A related art driving circuit for external compensation senses one display line in a vertical blanking interval of each frame period. To this end, a gate driver included in the related art driving circuit for external compensation generates a sensing gate signal during the vertical blanking interval and applies the sensing gate signal to pixels formed on a sensing target display line. The gate driver includes a plurality of cascade-connected stages.

A length of the vertical blanking interval is much shorter than a length of the vertical active period. Because each of the stages constituting the gate driver receives an output signal of a previous stage as a carry signal and sequentially operates in response to the carry signal, limited time of the vertical blanking interval may be insufficient to generate a desired sensing gate signal. For example, an Nth sensing gate signal generated in an Nth stage is necessary to sense an Nth display line of a display panel having a vertical resolution of "N". However, because the Nth stage is driven after all of the first to (N−1)th stages are sequentially driven, all of the N stages included in the gate driver have to be driven to generate the Nth sensing gate signal. However, one vertical blanking interval does not provide enough time to operate all the stages of the gate driver. Such a problem is magnified and becomes more significant as the vertical resolution of the display panel increases and as the number of display lines to be sensed in one vertical blanking interval increases.

SUMMARY

The present disclosure provides external compensation for a display device and a method of driving the same capable of generating a desired sensing gate signal without time constraints by performing a sensing drive in a vertical active period.

In one aspect, a display device comprises a display panel and a timing controller. The display panel includes a plurality of pixels arranged in display lines, a plurality of gate lines and a plurality of data lines. The display lines are driven with data signals from the data lines according to timing of gate pulses from the gate lines to display image data during vertical active periods. The gate pulses are not provided on the gate lines during vertical blanking intervals in between the vertical active periods. The vertical active periods occur during sensing drive frames and normal drive frames. The vertical active periods of the sensing drive frames include sensing periods and display periods. Electrical characteristics of sensing target display lines of the display panel are sensed during the sensing periods. The data lines are driven with the data signals without sensing the display lines during the vertical active periods of the normal drive frames and during the display periods of the vertical active periods of the sensing drive frames. The timing controller supplies timing signals to a gate driver as a plurality of clock pulses to control timing of the gate driver providing the gate pulses to the gate lines. The clock pulses have a first timing during the vertical active periods of the sensing drive frames and the clock pulses have a second timing during the vertical active periods of the normal drive frames in which the second timing is different than the first timing.

In another aspect a display device comprises a display panel and a timing controller. The display panel includes a plurality of pixels arranged in display lines, a plurality of gate lines and a plurality of data lines. The display lines are driven with data signals from the data lines according to timing of gate pulses from the gate lines to display image data during vertical active periods. The gate pulses are not provided on the gate lines during vertical blanking intervals in between the vertical active periods. The vertical active periods occur during sensing drive frames. The vertical active periods of the sensing drive frames include sensing periods and display periods. Electrical characteristics of sensing target display lines of the display panel are sensed during the sensing periods of the vertical active periods of the sensing drive frames. The data lines are driven with the data signals without sensing the display lines during the display periods of the vertical active periods of the sensing drive frames. A timing controller supplies clock pulses to a gate driver that cause the gate driver to sequentially select different ones of the display lines for receiving the data signals during the display periods of the vertical active periods of the sensing drive frames and to select a sensing target display line for sensing of the electrical characteristics during the sensing periods of the vertical active periods of the sensing drive frames.

In yet another aspect, a controller controls a display panel comprising a plurality of pixels arranged in display lines, a plurality of gate lines and a plurality of data lines. The controller comprises a timing controller and a sensing circuit. The timing controller controls timing of sensing drive frames and normal drive frames. The timing controller furthermore controls timing of vertical active periods and vertical blanking intervals occurring in the sensing drive frames and the normal drive frames. The timing controller furthermore controls control timing of sensing periods and display periods within the vertical active periods of the sensing drive frames. The timing controller furthermore supplies timing signals to a gate driver as a plurality of clock pulses to control timing of the gate driver providing gate pulses to the gate lines. The clock pulses have a first timing during the vertical active periods of the sensing drive frames and the clock pulses have a second timing during the vertical active periods of the normal drive frames in which the second timing is different than the first timing. The display lines are driven with data signals from the data lines according to timing of the gate pulses from the gate lines to display image data during the vertical active periods. The gate pulses are not provided on the gate lines during the vertical blanking intervals. Electrical characteristics of sensing target display lines of the display panel are sensed during the sensing periods. The data lines are driven with the data signals without sensing the display lines during the vertical active periods of the normal drive frames and during the display periods of the vertical active periods of the sensing drive frames. The sensing circuit receives the electrical characteristics of the sensing target display lines during the vertical active periods.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
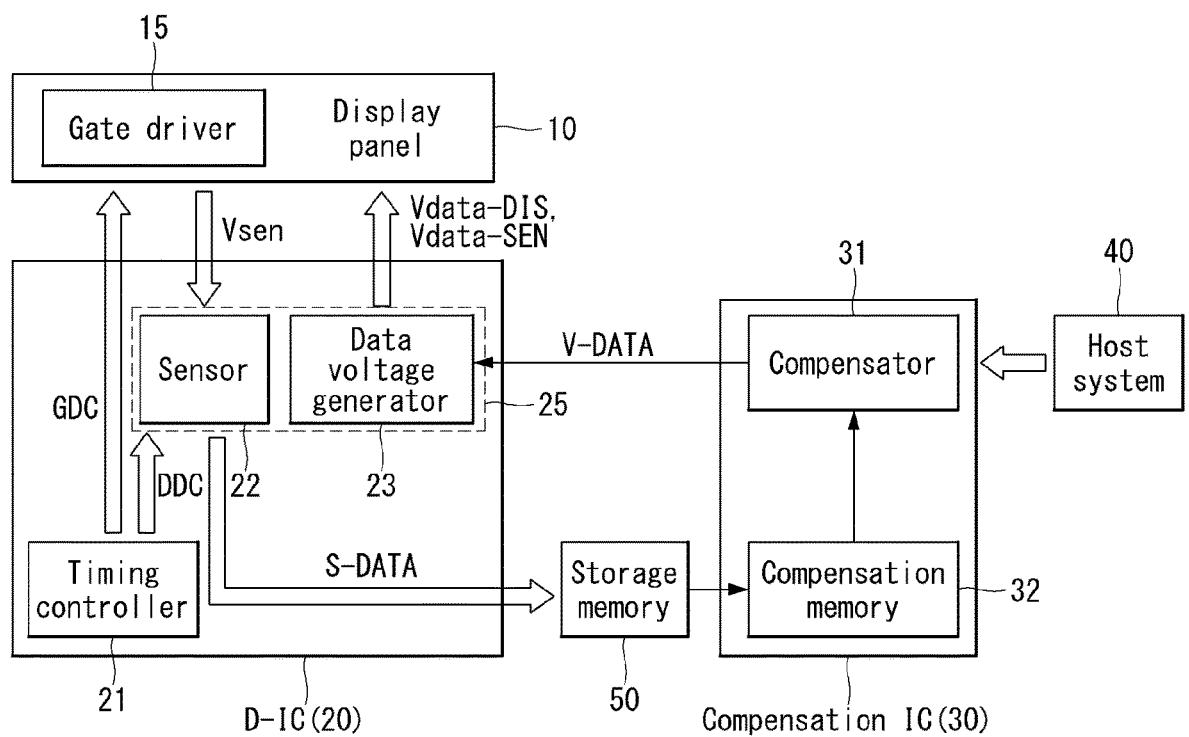
FIG. 1 is a block diagram of an electroluminescent display for external compensation according to an embodiment of the invention.

Reference will now be made in detail to embodiments of the present disclosure, examples of which are illustrated in the accompanying drawings. However, the present disclosure is not limited to embodiments disclosed below, and may be implemented in various forms. These embodiments are provided so that the present disclosure will be described more completely, and will fully convey the scope of the present disclosure to those skilled in the art to which the present disclosure pertains. Particular features of the present disclosure can be defined by the scope of the claims.

Shapes, sizes, ratios, angles, number, and the like illustrated in the drawings for describing embodiments of the present disclosure are merely exemplary, and the present disclosure is not limited thereto unless specified as such. Like reference numerals designate like elements throughout. In the following description, when a detailed description of certain functions or configurations related to this document that may unnecessarily cloud the gist of the invention have been omitted.

In the present disclosure, when the terms "include", "have", "comprised of", etc. are used, other components may be added unless "~ only" is used. A singular expression can include a plural expression as long as it does not have an apparently different meaning in context.

In the explanation of components, even if there is no separate description, it is interpreted as including margins of error or an error range.

In the description of positional relationships, when a structure is described as being positioned "on or above", "under or below", "next to" another structure, this description should be construed as including a case in which the structures directly contact each other as well as a case in which a third structure is disposed therebetween.

The terms "first", "second", etc. may be used to describe various components, but the components are not limited by such terms. The terms are used only for the purpose of distinguishing one component from other components. For example, a first component may be designated as a second component, and vice versa, without departing from the scope of the present invention.

The features of various embodiments of the present disclosure can be partially combined or entirely combined with each other, and can be technically interlocking-driven in various ways. The embodiments can be independently implemented, or can be implemented in conjunction with each other.

Various embodiments of the present disclosure will be described in detail below with reference to the accompanying drawings. In the following embodiments, an electroluminescent display will be described focusing on an organic light emitting diode (OLED) display including an organic light emitting material. However, it should be noted that embodiments of the present disclosure are not limited to the OLED display, and may be applied to an inorganic light emitting display including an inorganic light emitting material. Further, it should be noted that embodiments of the present disclosure may be applied not only to an electroluminescent display but also to various display devices such as a flexible display device and a wearable display device.

Figure 2:
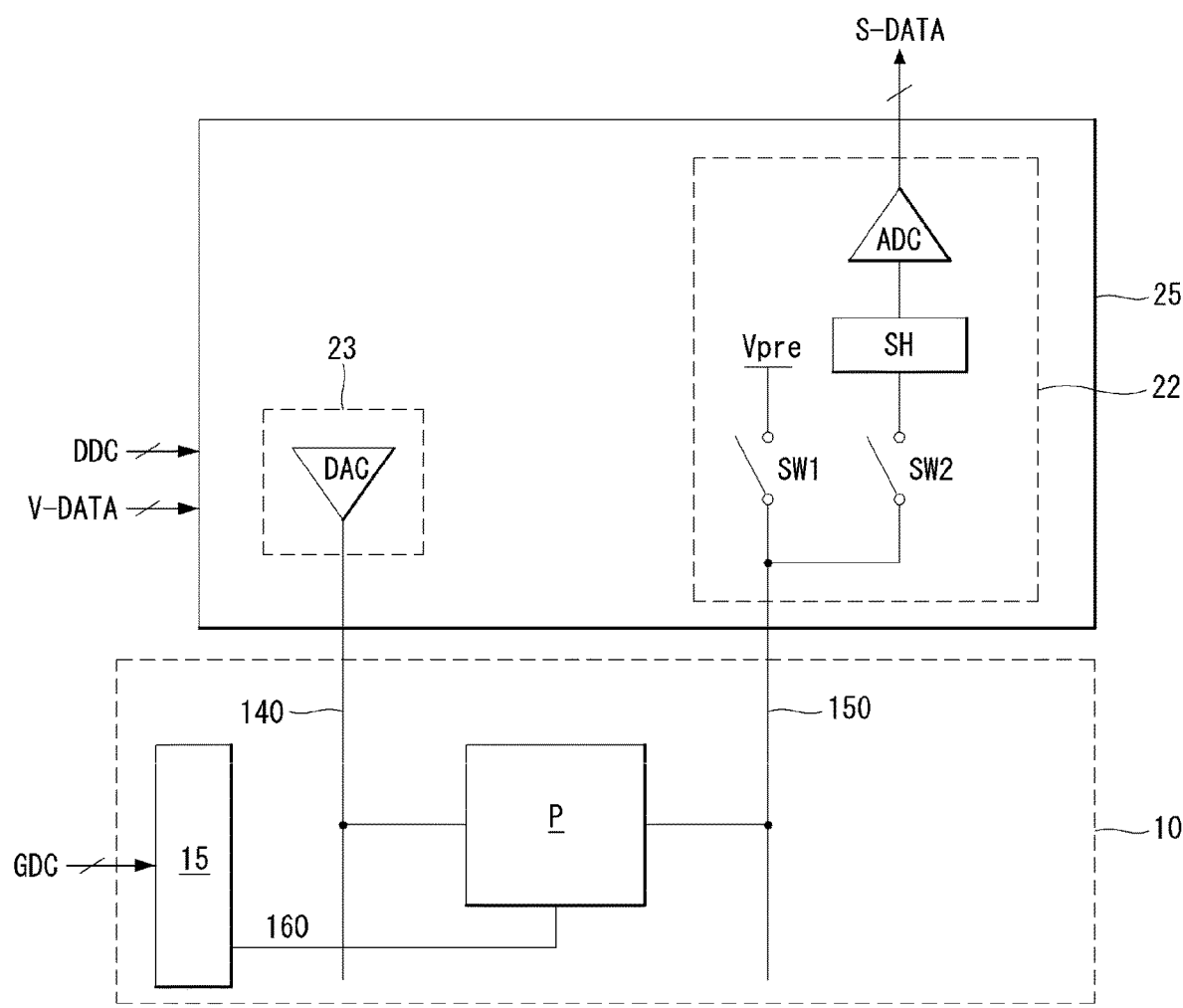
FIG. 2 schematically illustrates a connection configuration between a driving circuit for external compensation according to an embodiment of the invention and a pixel.
Figure 3:
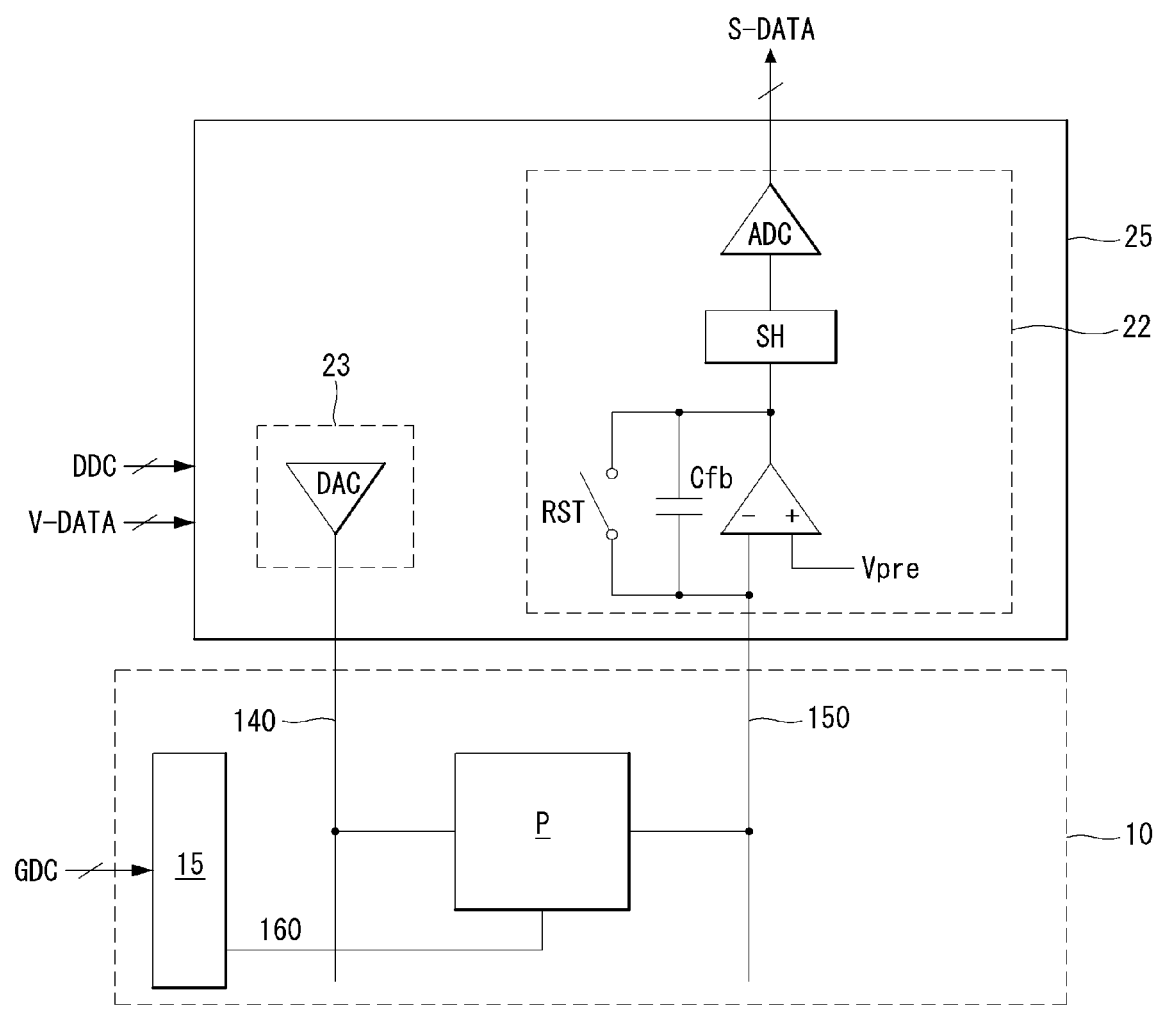
FIG. 3 illustrates another connection configuration between a driving circuit for external compensation according to an embodiment of the invention and a pixel.
Figure 4:
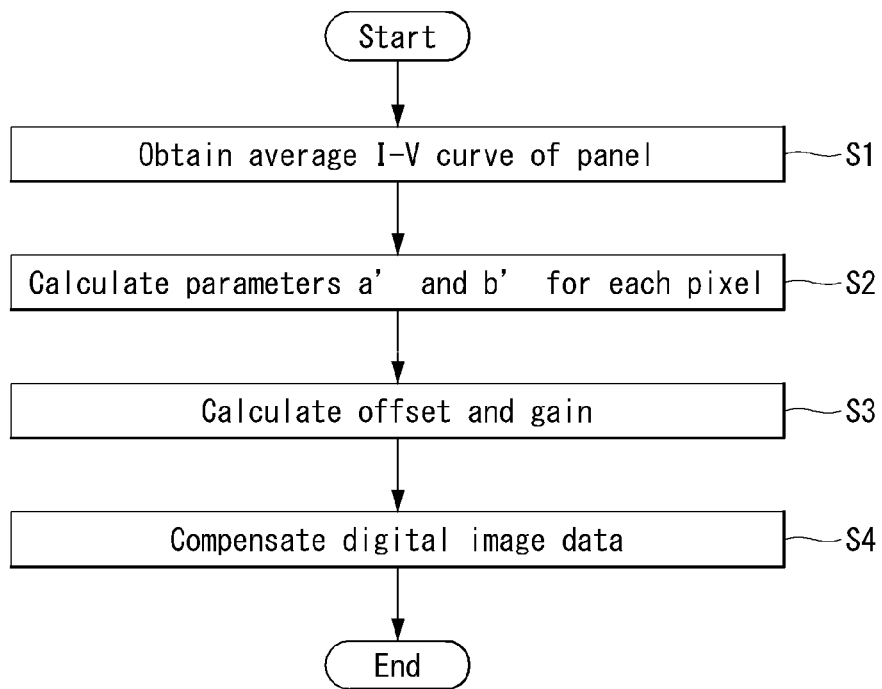
FIG. 4 is a flow chart illustrating an external compensation method according to an embodiment of the invention.
Figure 5A:
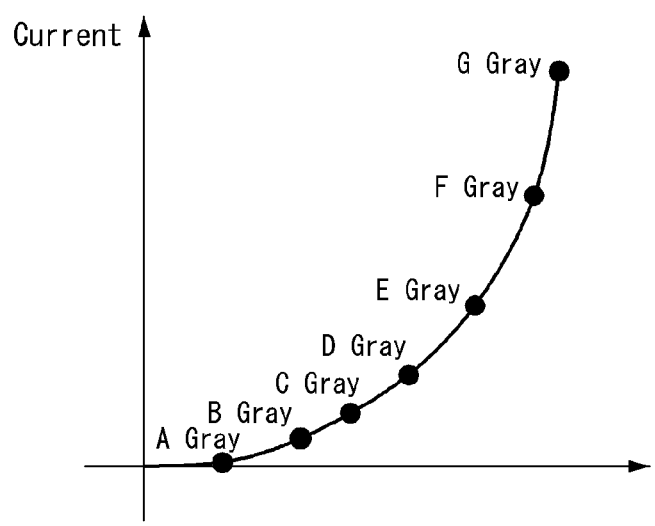
FIG. 5A illustrates that a reference curve equation is obtained in an external compensation method of FIG. 4.
Figure 5B:
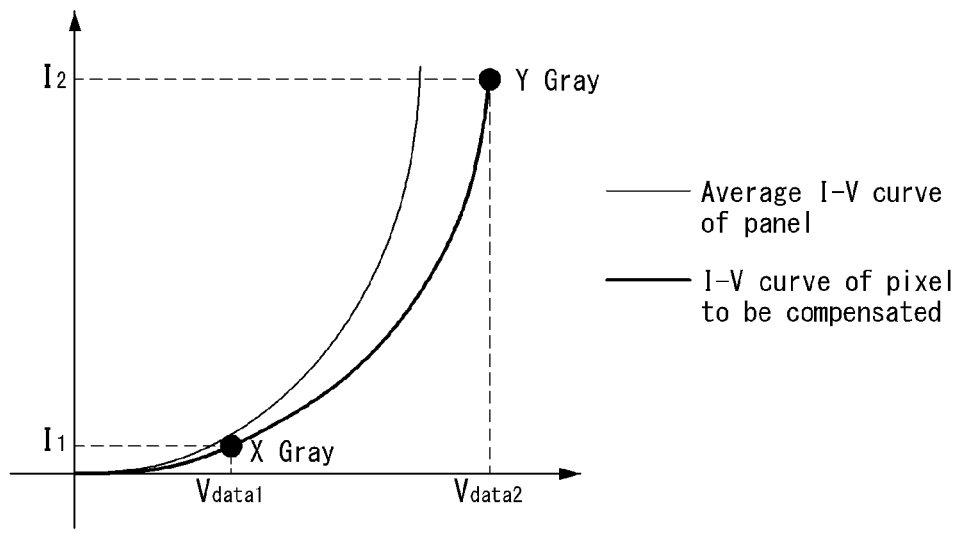
FIG. 5B illustrates an average I-V curve of a display panel and an I-V curve of a pixel to be compensated in an external compensation method of FIG. 4.
Figure 5C:
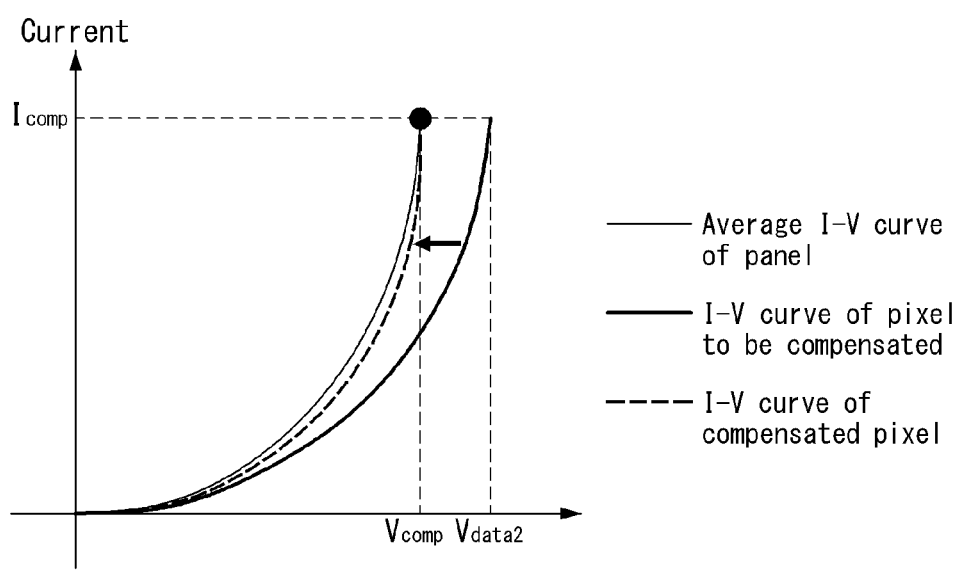
FIG. 5C illustrates an average I-V curve of a display panel, an I-V curve of a pixel to be compensated, and an I-V curve of a compensated pixel in an external compensation method of FIG. 4.

FIG. 1 is a block diagram of an electroluminescent display for external compensation according to an embodiment of the invention. FIGS. 2 and 3 illustrate connection configurations between a driving circuit for real-time external compensation according to an embodiment of the invention and a pixel. FIG. 4 is a flow chart illustrating an external compensation method according to an embodiment of the invention. FIG. 5A illustrates that a reference curve equation is obtained in the external compensation method of FIG. 4. FIG. 5B illustrates an average I-V curve of a display panel and an I-V curve of a pixel to be compensated in the external compensation method of FIG. 4. FIG. 5C illustrates an average I-V curve of a display panel, an I-V curve of a pixel to be compensated, and an I-V curve of a compensated pixel in the external compensation method of FIG. 4.

Referring to FIGS. 1 to 3, an electroluminescent display according to an embodiment of the invention may include a display panel 10, a driver IC (or referred to as "D-IC") 20, a compensation IC 30, a host system 40, and a storage memory 50. A driving circuit for real-time external compensation according to the embodiment of the invention includes a gate driver 15 included in the display panel 10, the driver IC 20, the compensation IC 30, and the storage memory 50.

The display panel 10 includes a plurality of pixels P arranged in display lines and a plurality of signal lines. The signal lines may include data lines 140 for supplying data signals (e.g., an analog data voltage Vdata) to the pixels P and gate lines 160 for supplying a gate signal to the pixels P. To display image data, the display lines are driven with the data signals from the data lines according to timing of gate pulses from the gate lines, as will be described in further detail below. Particularly, image data is displayed during the vertical active periods. In an embodiment, the gate pulses are not provided on the gate lines during vertical blanking intervals between the vertical active periods. Furthermore, in an embodiment, the data signals are not provided to the display lines during the vertical blanking intervals. In the embodiments disclosed herein, the gate signal may include a first gate signal and a second gate signal. In this instance, each gate line 160 may include a first gate line for supplying the first gate signal and a second gate line for supplying the second gate signal. The signal lines may further include sensing lines 150 that are used to sense electrical characteristics of the pixels P. However, the sensing lines 150 may be omitted depending on a circuit configuration of the pixels P. In this instance, the electrical characteristics of the pixels P may be sensed through the data lines 140.

The pixels P of the display panel 10 are disposed in a matrix to form a pixel array. Each pixel P may be connected to one of the data lines 140, one of the sensing lines 150, and at least one of the gate lines 160. Each pixel P is configured to receive a high potential pixel power and a low potential pixel power from a power source or generator. To this end, the power generator may supply the high potential pixel power to the pixel P through a high potential pixel power line or a pad and may supply the low potential pixel power to the pixel P through a low potential pixel power line or a pad.

The driver IC 20 may include a timing controller 21 and a data driver 25. The data driver 25 may include a sensor 22 and a data voltage generator 23. However, the embodiments are not limited thereto.

The timing controller 21 may generate a gate timing control signal GDC for controlling operation timing of the gate driver 15 and a data timing control signal DDC for controlling operation timing of the data driver 25 based on timing signals, for example, a vertical sync signal Vsync, a horizontal sync signal Hsync, a dot clock signal DCLK, and a data enable signal DE received from the host system 40.

The data timing control signal DDC may include a source start pulse, a source sampling clock, and a source output enable signal, and the like, but is not limited thereto. The source start pulse controls start timing of data sampling of the data voltage generator 23. The source sampling clock is a clock signal that controls the sampling timing of data based on a rising edge or a falling edge thereof. The source output enable signal controls output timing of the data voltage generator 23.

The gate timing control signal GDC may include a gate start pulse, a gate shift clock, and the like, but is not limited thereto. The gate start pulse is applied to a stage of the gate driver 15 for generating a first output and activates an operation of the stage. The gate shift clock is a clock signal that is commonly input to stages and shifts the gate start pulse.

The timing controller 21 may furthermore control timing of sensing drive frames and normal drive frames. The timing controller 21 controls a sensing drive timing of one display line (or display lines) of the display panel 10 and a display drive timing of other display lines of the display panel 10 in a vertical active period of a specific frame (referred to herein as a sensing drive frame) in accordance with a particular sequence, thereby implementing real-time sensing. In embodiments disclosed herein, the "display line" indicates not a physical signal line but a pixel block line formed by the adjacent pixels P.

A sensing drive (operation) and a display drive (operation) are performed in a vertical active period of a sensing drive frame. In embodiments disclosed herein, the sensing drive frame is a frame in which the sensing drive is performed on some of the display lines of the display panel 10, and the display drive is performed on the remaining display lines of the display panel 10. Further, in the following description, the display line, on which the sensing drive is performed, is referred to as a "sensing target display line", and the display line, on which the display drive is performed, is referred to as a "display target display line".

During a sensing drive frame, the sensing drive operation is performed on a sensing target display line of the display panel 10, and an image is displayed on display target display lines excluding the sensing target display line of the display panel 10. In other words, both the display drive and sensing drive operations are performed during the sensing drive frame. For example, in one embodiment, the vertical active period of the sensing drive frame includes one or more sensing periods during which the electrical characteristics of the sensing target display line(s) are sensed and one or more display periods during which the data lines are driven with the data signals (without sensing) for the remaining display lines. One sensing drive frame or a plurality of sensing drive frames may be included in a particular period of time depending on a frame frequency. The remaining frame(s) excluding the sensing drive frame(s) from the particular period of time is/are a normal drive frame. During the normal drive frame, only the display drive operation is performed on all the display lines of the display panel 10. In other words, during the normal drive frame, the data lines are driven with the data signals to perform the display drive operation without sensing the display lines and thus the sensing drive operation is not performed.

The sensing drive operation is an operation of sensing electrical characteristics of corresponding pixels P disposed on the sensing target display line(s) in the sensing drive frame, converting a sensing result (i.e., an analog sensing voltage Vsen) of the corresponding pixels P into digital sensing data S-DATA, and updating a compensation value for compensating for changes in the electrical characteristics of the corresponding pixels P based on the digital sensing data S-DATA.

The display drive operation is an operation of displaying an input image on previously sensed display lines (i.e., display target display lines) and is performed in the sensing drive frame and the normal drive frame. More specifically, the display drive operation modulates digital image data to be input to the previously sensed pixels P based on the updated compensation value and applies an analog data voltage Vdata corresponding to modulated digital image data V-DATA to the corresponding pixels P, thereby displaying the input image on the previously sensed pixels P.

The timing controller 21 may differently generate timing control signals GDC and DDC for the display drive operation and timing control signals GDC and DDC for the sensing drive operation. Both the sensing drive and display drive operations are performed in a vertical active period of the sensing drive frame under the control of the timing controller 21. When the sensing drive operation is performed in the vertical active period of the sensing drive frame together with the display drive operation, the sensing drive operation has less time constraints than when the sensing drive operation is performed in a vertical blanking interval. However, the time allotted to the display drive operation has to be reduced to secure a sufficient sensing time in the vertical active period of the sensing drive frame. To this end, the timing controller 21 may cause a cycle of a gate timing control signal of the sensing drive frame to be shorter than a cycle of a gate timing control signal of the normal drive frame, in which only the display drive operation is performed. Thus, the timing control signal GDC comprises clock pulses that cause the gate driver 15 to supply the gate pulses to the gate lines. The clock pulses have a first timing (e.g., a first pulse width and first frequency) during the normal drive frames and have a second timing (e.g., a second pulse width and second frequency) during the sensing drive frames in which the second timing is different than the first timing, as will be explained further below. In an embodiment, the length of the sensing drive frames may be equal to the lengths of the normal drive frames because the gate pulses in the display period of the sensing drive frame are shortened to compensate for the longer clock pulse used in the sensing period of the sensing drive frame.

The data voltage generator 23 includes a digital-to-analog converter (DAC) converting a digital signal into an analog signal. The data voltage generator 23 generates a display data voltage Vdata-DIS for the display drive operation and applies the display data voltage Vdata-DIS to the previously sensed pixels P of the display panel 10. To this end, the data voltage generator 23 may convert digital image data V-DATA modulated by the compensation IC 30 into an analog gamma voltage and output a conversion result to the data lines 140 as the display data voltage Vdata-DIS. Further, the data voltage generator 23 generates a sensing data voltage Vdata-SEN for the sensing drive operation and applies the sensing data voltage Vdata-SEN to the sensing target pixels P of the display panel 10 through the data lines 140.

In order to perform the sensing drive operation, the sensor 22 may sense electrical characteristics of the sensing target pixels P, for example, electrical characteristics of driving elements and/or light emitting elements included in the sensing target pixels P through the sensing lines 150. The sensor 22 may include a voltage sensing unit or a current sensing unit. The voltage sensing unit may sense a voltage charged to a specific node of the sensing target pixel P as an analog sensing voltage Vsen. The current sensing unit may directly sense a current flowing in a specific node of the sensing target pixel P and obtain an analog sensing voltage Vsen.

As shown in FIG. 2, the voltage sensing unit includes a sample and hold circuit SH, an analog-to-digital converter (ADC), and first and second switches SW1 and SW2. The voltage sensing unit senses a voltage of a source electrode of a driving element included in the sensing target pixel P (i.e., the voltage of the source electrode of the driving element charged to a line capacitor of the sensing line 150), that depends on a pixel current of the driving element. The first and second switches SW1 and SW2 are selectively turned on. The first switch SW1 is a switch for supplying an initialization voltage Vpre to the sensing line 150, and the second switch SW2 is a switch that is turned on in synchronization with sampling timing of the analog sensing voltage Vsen. The sample and hold circuit SH is connected to the sensing line 150 during the turn-on of the second switch SW2 and senses a voltage charged to the line capacitor of the sensing line 150 as the analog sensing voltage Vsen. The ADC converts the analog sensing voltage Vsen sampled by the sample and hold circuit SH into digital sensing data S-DATA.

As shown in FIG. 3, the current sensing unit further includes a current integrator at a previous stage of a sample and hold circuit SH and directly senses the pixel current of the driving element included in the sensing target pixel P flowing in the sensing line 150. The current integrator integrates the pixel current flowing through the sensing line 150 and generates the analog sensing voltage Vsen. The current integrator includes an amplifier AMP including an inverting input terminal (−) receiving the pixel current of the driving element from the sensing line 150, a non-inverting input terminal (+) receiving the initialization voltage Vpre, and an output terminal, an integrating capacitor Cfb connected between the inverting input terminal (−) and the output terminal of the amplifier AMP, and a reset switch RST connected to both ends of the integrating capacitor Cfb. The current integrator is connected to the ADC via the sample and hold circuit SH. The sample and hold circuit SH samples the analog sensing voltage Vsen output from the amplifier AMP and supplies the sampled analog sensing voltage Vsen to the ADC. The ADC converts analog sensing values Vsen sampled by the sample and hold circuit SH into digital sensing data S-DATA.

The sensor 22 may simultaneously process a plurality of analog sensing values Vsen using a plurality of ADCs in parallel and may sequentially process the plurality of analog sensing values Vsen using one ADC in series. A sampling rate of the ADC and the accuracy of the sensing are in a trade-off relationship. The ADC using a parallel processing method is advantageous to increase the accuracy of the sensing because the ADC using the parallel processing method can further reduce a sampling rate compared to the ADC using a serial processing method. The ADC may be implemented as a flash ADC, an ADC using a tracking method, a successive approximation register ADC, and the like. In the sensing drive, the ADC converts the analog sensing voltage Vsen into the digital sensing data S-DATA and then supplies the digital sensing data S-DATA to the storage memory 50.

In the sensing drive operation, the storage memory 50 stores the digital sensing data S-DATA input from the sensor 22. The storage memory 50 may be implemented as a flash memory, but is not limited thereto.

In order to perform the display drive operation, the compensation IC 30 calculates an offset and a gain for each pixel based on the digital sensing data S-DATA read from the storage memory 50. The compensation IC 30 modulates (or corrects) digital image data to be input to the previously sensed pixels P depending on the calculated offset and gain, and supplies the modulated digital image data V-DATA to the driver IC 20. To this end, the compensation IC 30 may include a compensator 31 and a compensation memory 32.

The compensation memory 32 allows access to the digital sensing data S-DATA read from the storage memory 50 to the compensator 31. The compensation memory 32 may be a random access memory (RAM), for example, a double data rate synchronous dynamic RAM (DDR SDRAM), but is not limited thereto.

As shown in FIGS. 4 to 5C, the compensator 31 may include a compensation algorithm that performs a compensation operation so that a current (I)-voltage (V) curve of a pixel to be compensated coincides with an average I-V curve. The average I-V curve may be obtained through a plurality of sensing operations.

More specifically, as shown in FIGS. 4 and 5A, the compensator 31 performs the sensing of a plurality of gray levels (for example, a total of seven gray levels A to G) and then obtains the following Equation 2 corresponding to the average I-V curve through a known least square method in step S1.

$$I = a(V_{data} - b)^c \qquad \text{[Equation 2]}$$

where "a" is electron mobility of the driving TFT, "b" is a threshold voltage of the driving TFT, and "c" is a physical property value of the driving TFT.

As shown in FIGS. 4 and 5B, the compensator 31 calculates parameter values a' and b' of the previously sensed pixel P based on current values I1 and I2 and gray values (gray levels X and Y) (i.e., data voltage values Vdata1 and Vdata2 of digital level) measured at two points in step S2.

$$I_1 = a'(V_{data1} - b')^c$$

$$I_2 = a'(V_{data2} - b')^c \qquad \text{[Equation 3]}$$

The compensator 31 may calculate the parameter values a' and b' of the previously sensed pixel P using a quadratic equation in the above Equation 3.

As shown in FIGS. 4 and 5C, the compensator 31 may calculate an offset and a gain for causing the I-V curve of the pixel to be compensated to coincide with the average I-V curve in step S3. The offset and the gain of the compensated pixel are expressed by Equation 4.

$$V_{comp} = \underbrace{\left(\frac{a}{a'}\right)^{\frac{1}{c}}}_{\text{Gain}} \times V_{data} + \underbrace{\left(b' - b\left(\frac{a}{a'}\right)^{\frac{1}{c}}\right)}_{\text{Offset}}$$

[Equation 4]

where "Vcomp" is a compensation voltage.

The compensator 31 corrects digital image data to be input to the previously sensed pixel P so that the digital image data corresponds to the compensation voltage Vcomp, in step S4. In other words, the compensator 31 converts digital image data to be input to the previously sensed pixel P into a data voltage value Vdata of a digital level. The compensator 31 multiplies the gain by the data voltage value Vdata and then adds the offset to it, thereby generating the compensation voltage Vcomp of the digital level. The compensator 31 converts the compensation voltage Vcomp of the digital level into the modulated digital image data V-DATA.

The host system 40 may supply digital image data to be input to the pixels P of the display panel 10 to the compensation IC 30. The host system 40 may further supply user input information, for example, digital brightness information to the compensation IC 30. The host system 40 may be implemented as an application processor.

The gate driver 15 generates a display gate signal for the display drive based on the gate timing control signal GDC and supplies the display gate signal to the gate lines 160 connected to the display target display line. The display gate signal is a signal synchronized with an application timing of the display data voltage Vdata-DIS. The gate driver 15 generates a sensing gate signal for the sensing drive based on the gate timing control signal GDC and supplies the sensing gate signal to the gate lines 160 connected to the sensing target display line. The sensing gate signal is a signal synchronized with an application timing of the sensing data voltage Vdata-SEN.

The gate driver 15 includes a gate shift register that operates in response to the gate timing control signal GDC received from a level shifter. The level shifter may be included in the timing controller 21, but is not limited thereto. The level shifter may receive the gate timing control signal GDC including the gate start pulse and N-phase gate shift clocks from the timing controller 21, where N is an integer equal to or greater than 2. The level shifter level-shifts a transistor-transistor-logic (TTL) level voltage of the gate timing control signal GDC to a gate high voltage and a gate low voltage that can switch on and off a TFT of the gate shift register. The level shifter supplies the level-shifted gate start pulse and the level-shifted N-phase gate shift clocks to the gate shift register.

The gate shift register includes a plurality of stages, each of which shifts the gate start pulse in response to the N-phase gate shift clocks in a vertical active period of each frame and outputs the display gate signal and/or the sensing gate signal. The plurality of stages may be cascade-connected. An operation of an uppermost stage of the plurality of stages is activated in response to the gate start pulse, and an operation of each of remaining stages is activated in response to one of output signals (for examples, carry signals) of previous stages.

The gate shift register may be directly formed on a lower substrate of the display panel 10 in a gate-in panel (GIP) manner. The gate shift register may be formed in a non-display area (i.e., a bezel area) outside the pixel array of the display panel 10 through the same TFT process as the pixel array.

Figure 6:
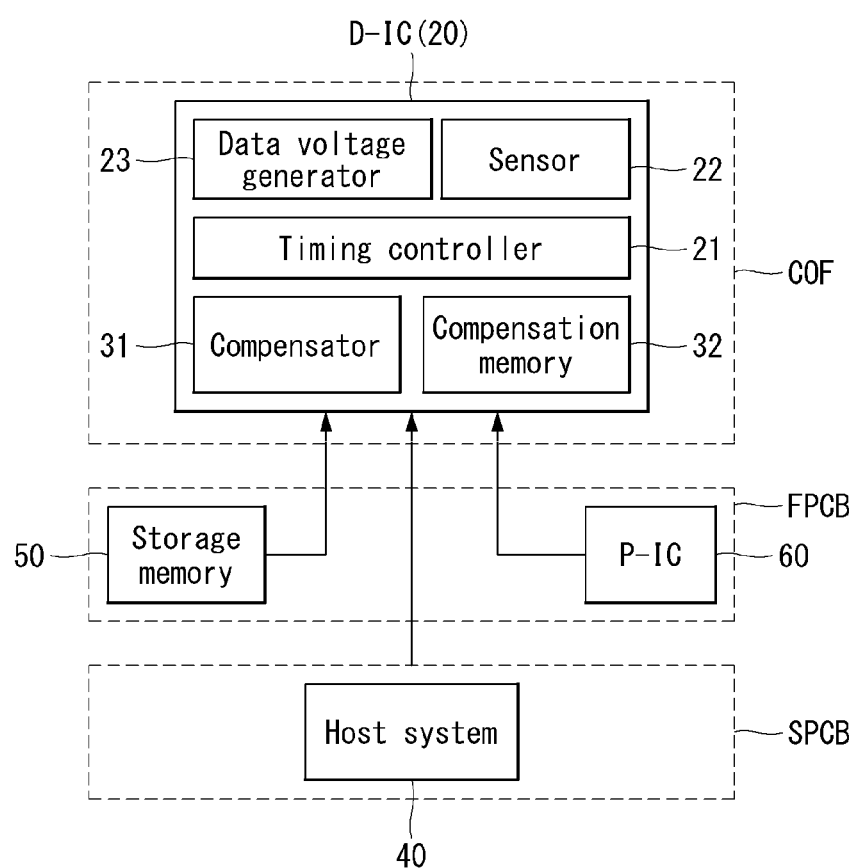
FIGS. 6 to 8 illustrate various examples of an external compensation module.
Figure 7:
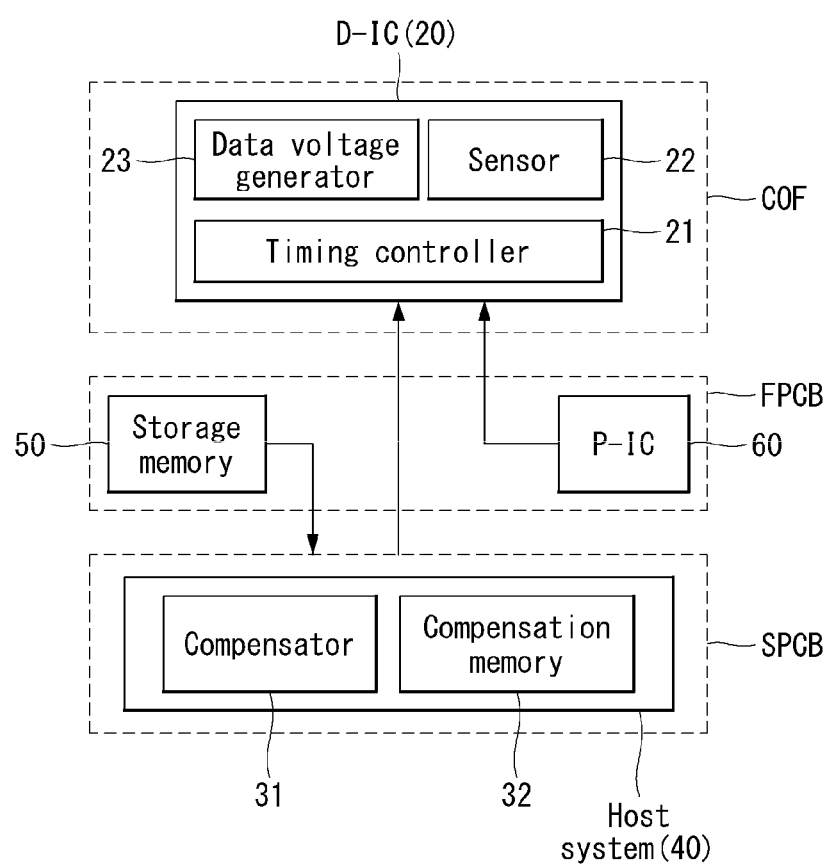
Figure 8:
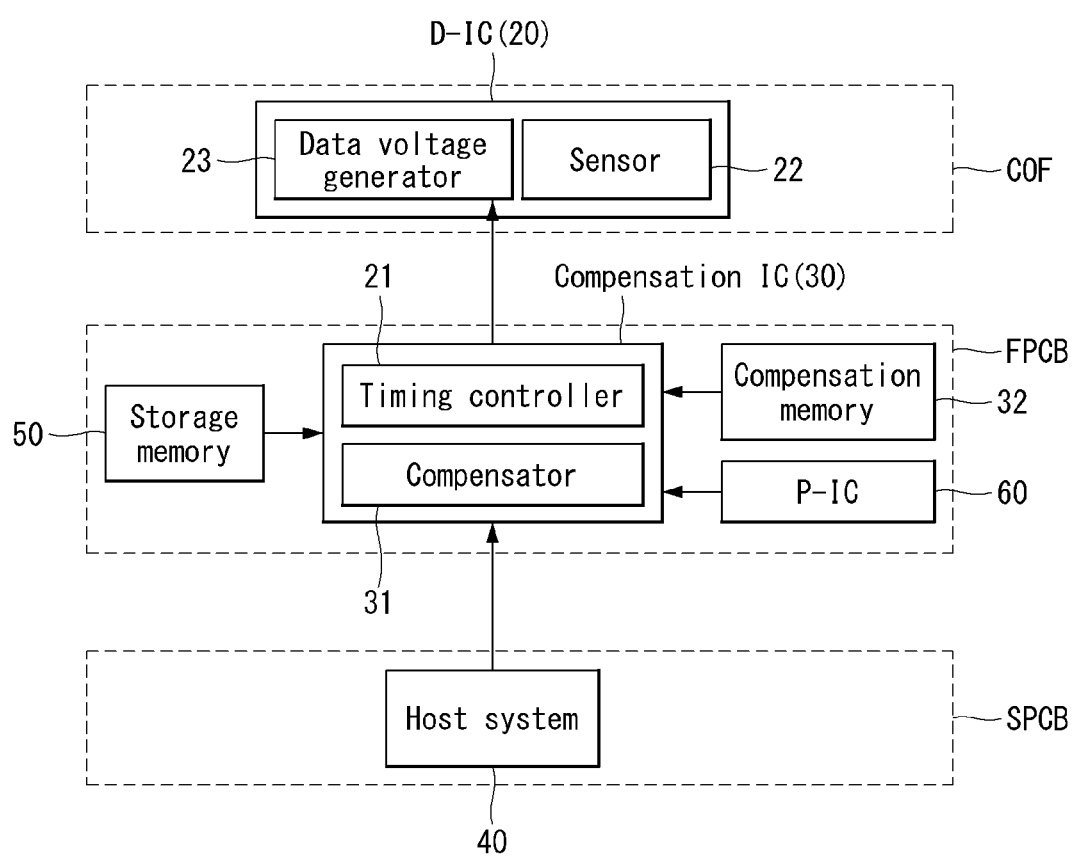

FIGS. 6 to 8 illustrate various examples of an external compensation module.

Referring to FIG. 6, the electroluminescent display according to the embodiment of the invention may include a driver IC (or referred to as "D-IC") 20 mounted on a chip-on film (COF), a storage memory 50 and a power IC (or referred to as "P-IC") 60 mounted on a flexible printed circuit board (FPCB), and a host system 40 mounted on a system printed circuit board (SPCB), in order to implement an external compensation module.

The driver IC (D-IC) 20 may further include a compensator 31 and a compensation memory 32 in addition to a timing controller 21, a sensor 22, and a data voltage generator 23. The external compensation module is implemented by combining the driver IC (D-IC) 20 and a compensation IC 30 (see FIG. 1) into one chip. The power IC (P-IC) 60 generates various driving powers required to operate the external compensation module.

Referring to FIG. 7, the electroluminescent display according to the embodiment of the invention may include a driver IC (or referred to as "D-IC") 20 mounted on a chip-on film (COF), a storage memory 50 and a power IC (or referred to as "P-IC") 60 mounted on a flexible printed circuit board (FPCB), and a host system 40 mounted on a system printed circuit board (SPCB), in order to implement an external compensation module.

The external compensation module of FIG. 7 is different from the external compensation module of FIG. 6 in that a compensator 31 and a compensation memory 32 are mounted on the host system 40 without being mounted on the driver IC 20. The external compensation module of FIG. 7 is implemented by integrating a compensation IC 30 (see FIG. 1) into the host system 40 and is meaningful in that the configuration of the driver IC 20 can be simplified.

Referring to FIG. 8, the electroluminescent display according to the embodiment of the invention may include a source driver IC SD-IC mounted on a chip-on film (COF), a storage memory 50, a compensation IC 30, a compensation memory 32, and a power IC (or referred to as "P-IC") 60 mounted on a flexible printed circuit board (FPCB), and a host system 40 mounted on a system printed circuit board (SPCB), in order to implement an external compensation module.

The external compensation module of FIG. 8 is different from the external compensation modules of FIGS. 6 and 7 in that the configuration of the source driver IC SD-IC is further simplified by mounting only a data voltage generator 23 and a sensor 22 in the source driver IC SD-IC, and a timing controller 21 and the compensation memory 32 are mounted in the compensation IC 30 that is separately manufactured. The external compensation module of FIG. 8 can easily perform an uploading and downloading operation of a compensation parameter by together mounting the compensation IC 30, the storage memory 50, and the compensation memory 32 on the flexible printed circuit board.

Figure 9:
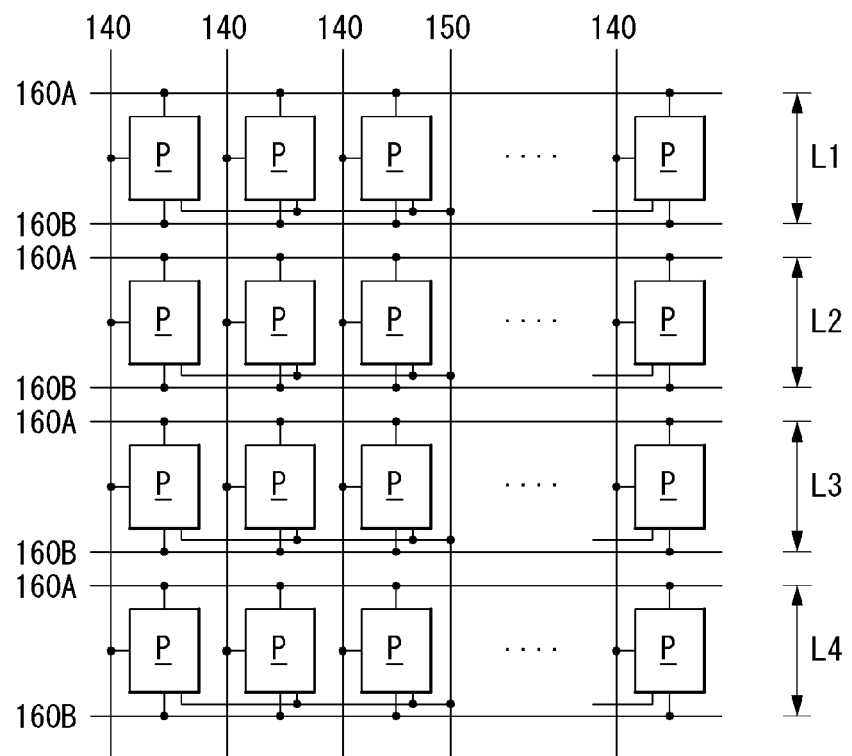
FIG. 9 illustrates an example of a pixel array included in a display panel.
Figure 10:
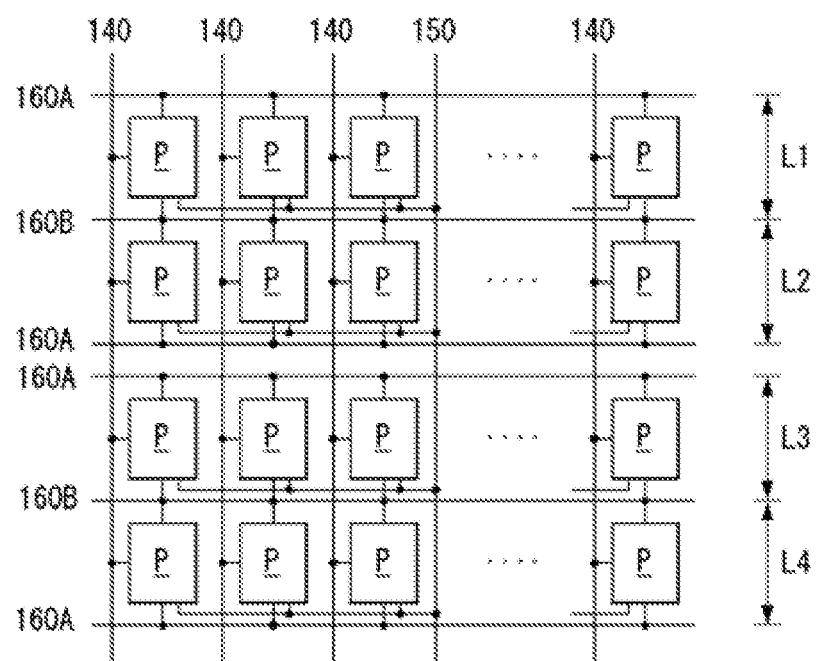
FIG. 10 illustrates another example of a pixel array included in a display panel.

FIGS. 9 and 10 illustrate an example of a pixel array included in the display panel.

Referring to FIGS. 9 and 10, a pixel array according to the embodiment of the invention includes a plurality of display lines L1, L2, L3 and L4 formed by adjacent pixels P. Each of the plurality of display lines L1, L2, L3 and L4 is not a physical signal line but a pixel block line formed by the adjacent pixels P. The horizontally adjacent pixels P on each of the display lines L1, L2, L3 and L4 are connected to the different data lines 140, respectively. The horizontally adjacent pixels P on each of the display lines L1, L2, L3 and L4 are connected to the different sensing lines 150 in units of M pixels, where M is a positive integer equal to or greater than 2. Hence, an aperture ratio of the display panel 10 can increase.

Referring to FIG. 9, the horizontally adjacent pixels P on each of the display lines L1, L2, L3 and L4 may be connected to a first gate line 160A and a second gate line 160B. In other words, two gate lines 160A and 160B may be allocated to each of the display lines L1, L2, L3 and L4 and each of the first gate line 160A and the second gate line 160B are coupled to only one of the display lines.

On the contrary, referring to FIG. 10, a first gate line 160A may be individually connected to the display lines L1, L2, L3 and L4, and a second gate line 160B may be shared by two adjacent display lines. In other words, the first and second display lines L1 and L2 may share one second gate line 160B, and the third and fourth display lines L3 and L3 may share another second gate line 160B. When the pixel array is designed to share some gate lines, an aperture ratio of the display panel 10 can increase. Further, the gate driver 15 can be simplified, and a bezel area, on which the gate driver 15 is mounted, can decrease.

Figure 11:
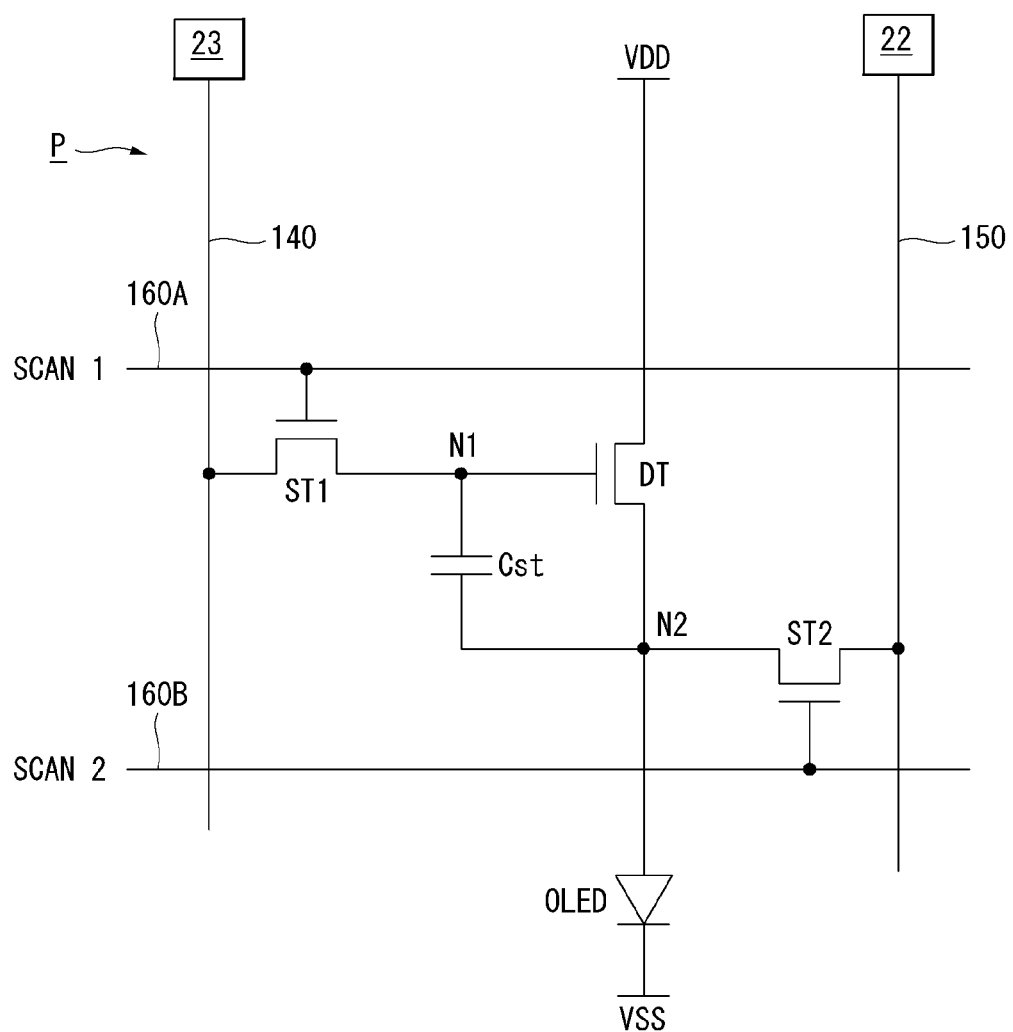
FIG. 11 is an equivalent circuit diagram of a pixel included in a pixel array of FIGS. 9 and 10.

FIG. 11 is an equivalent circuit diagram of a pixel included in a pixel array of FIGS. 9 and 10.

Referring to FIG. 11, each of pixels P constituting a pixel array may include an OLED, a driving TFT DT, a storage capacitor Cst, a first switching TFT ST1, and a second switching TFT ST2. However, the pixel configuration of FIG. 11 is merely an example, and embodiments are not limited thereto.

The pixel P of FIG. 11 may be a display target pixel and may be a sensing target pixel. Thus, a first gate signal SCAN1 may be a first display gate signal or a first sensing gate signal, and a second gate signal may be a second display gate signal or a second sensing gate signal. A data voltage supplied to the data line 140 by the data voltage generator 23 may be a display data voltage Vdata-DIS (see FIG. 1) or a sensing data voltage Vdata-SEN (see FIG. 1).

The OLED is a light emitting element that emits light with a pixel current input from the driving TFT DT. The OLED includes an anode electrode, a cathode electrode, and an organic compound layer between the anode electrode and the cathode electrode. The anode electrode is connected to a first node N1 via a storage capacitor Cst that is a gate electrode of the driving TFT DT. The cathode electrode is connected to an input terminal of a low potential driving voltage VSS. A gray level of an image displayed on a corresponding pixel P is determined depending on an amount of light emitted by the OLED.

The driving TFT DT is a driving element controlling a pixel current input to the OLED depending on a gate-to-source voltage Vgs of the driving TFT DT. The driving TFT DT includes a gate electrode connected to the first node N1, a drain electrode connected to an input terminal of a high potential driving voltage VDD, and a source electrode connected to a second node N2.

The storage capacitor Cst is connected between the first node N1 and the second node N2. The storage capacitor Cst holds the gate-to-source voltage Vgs of the driving TFT DT for a particular time.

The first switching TFT ST1 applies the data voltage on the data line 140 to the first node N1 in response to the first gate signal SCAN1. The first switching TFT ST1 includes a gate electrode connected to the first gate line 160A, a drain electrode connected to the data line 140, and a source electrode connected to the first node N1.

The second switching TFT ST2 switches on and off a current flow between the second node N2 and the sensing line 150 in response to the second gate signal SCAN2. The second switching TFT ST2 includes a gate electrode connected to the second gate line 160B, a drain electrode connected to the sensing line 150, and a source electrode connected to the second node N2. When the second switching TFT ST2 is turned on, the second node N2 and the sensor 22 are electrically connected.

Figure 12:
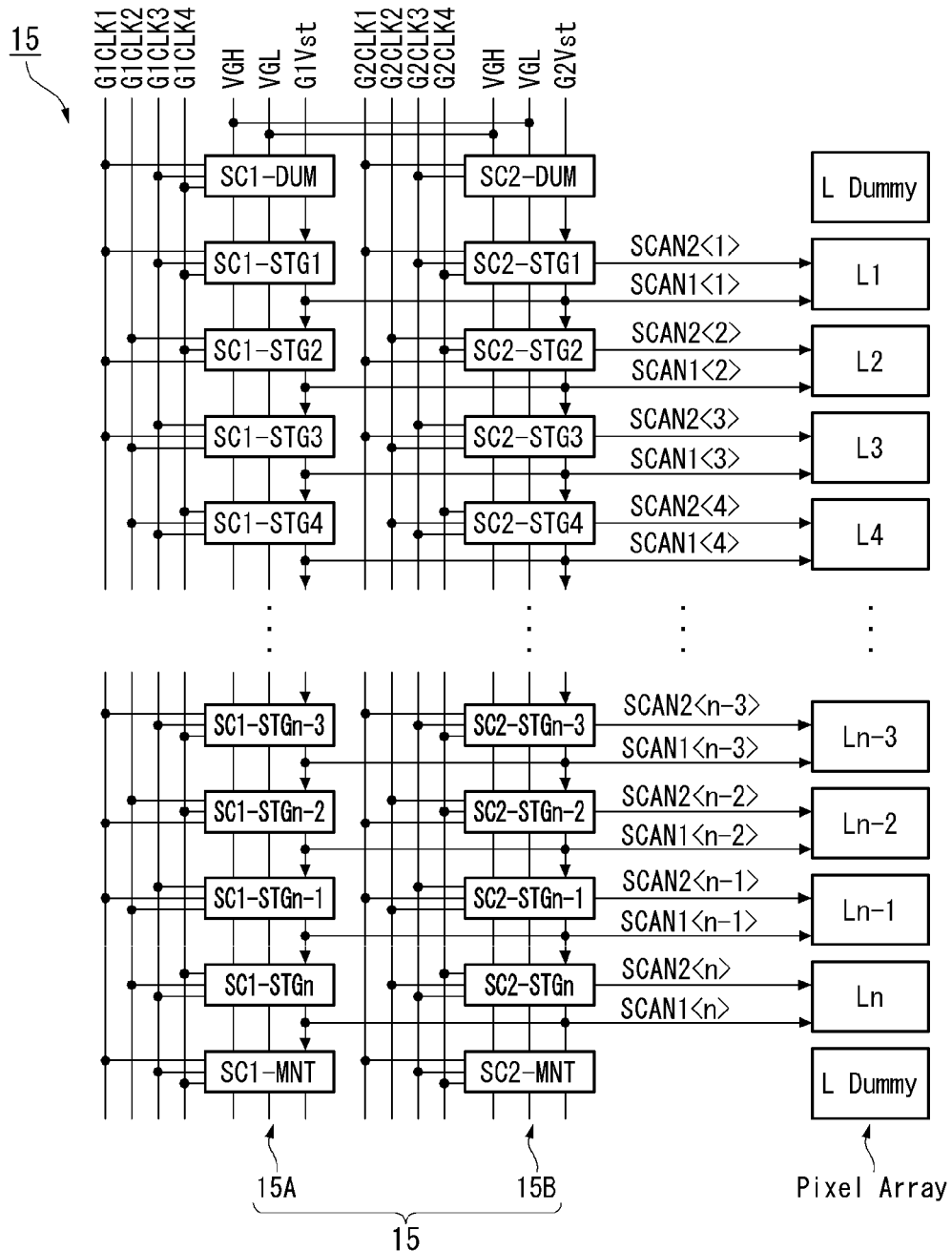
FIG. 12 illustrates an exemplary configuration of a gate driver for driving a pixel array of FIG. 9.

FIG. 12 illustrates an exemplary configuration of a gate driver for driving the pixel array of FIG. 9.

Referring to FIG. 12, an exemplary configuration of the gate driver 15 according to the embodiment of the invention includes a first gate driver circuit 15A for generating a first gate signal SCAN1 to be supplied to the first gate lines 160A and a second gate driver circuit 15B for generating a second gate signal SCAN2 to be supplied to the second gate lines 160B.

More specifically, the gate driver 15 includes the first gate driver circuit 15A having as many stages SC1-STG1 to SC1-STGn as display lines L1 to Ln of the pixel array and the second gate driver circuit 15B having as many stages SC2-STG1 to SC2-STGn as the display lines L1 to Ln of the pixel array.

In FIG. 12, "SC1-DUM", "SC2-DUM", "SC1-MNT" and "SC2-MNT" denote dummy stages; "L Dummy" denotes a dummy display line; and "VGH" and "VGL" denote driving voltages applied to the stages. "VGH" is a gate high voltage, and "VGL" is a gate low voltage. The dummy stage and the dummy display line may be selectively included or excluded. Because a kickback effect of a display line adjacent to the dummy display line is reduced by the dummy stage and the dummy display line, a charging signal of the display line adjacent to the dummy display line can be stabilized. A pixel configuration of the dummy display line is similar to a pixel configuration of the display line, but may be configured not to emit light. Namely, the pixel of the dummy display line may not include an OLED or may not receive the data voltage or the gate signal.

The first gate driver circuit 15A generates a first display gate signal SCAN1 and sequentially supplies the first display gate signal SCAN1 to the first gate lines 160A positioned on the display target display lines (i.e., the first gate lines 160A connected to the display target pixels). Further, the first gate driver circuit 15A generates a first sensing gate signal SCAN1 and supplies the first sensing gate signal SCAN1 to the first gate line 160A positioned on at least one sensing target display line (i.e., the first gate line 160A connected to the sensing target pixels).

The stages SC1-STG1 to SC1-STGn constituting the first gate driver circuit 15A may be individually connected to the display lines, respectively. The stages SC1-STG1 to SC1-STGn of the first gate driver circuit 15A sequentially shift a first gate start pulse G1Vst in accordance with a first gate shift clock group including G1CLK1 to G1CLK4 and generate the first display gate signal SCAN1 and the first sensing gate signal SCAN1.

The second gate driver circuit 15B generates a second display gate signal SCAN2 and sequentially supplies the second display gate signal SCAN2 to the second gate lines 160B positioned on the display target display lines (i.e., the second gate lines 160B connected to the display target pixels). Further, the second gate driver circuit 15B generates a second sensing gate signal SCAN2 and supplies the second sensing gate signal SCAN2 to the second gate line 160B positioned on at least one sensing target display line (i.e., the second gate line 160B connected to the sensing target pixels).

The stages SC2-STG1 to SC2-STGn constituting the second gate driver circuit 15B may be individually connected to the display lines, respectively. The stages SC2-STG1 to SC2-STGn of the second gate driver circuit 15B sequentially shift a second gate start pulse G2Vst in accordance with a second gate shift clock group including G2CLK1 to G2CLK4 and generate the second display gate signal SCAN2 and the second sensing gate signal SCAN2.

Figure 13:
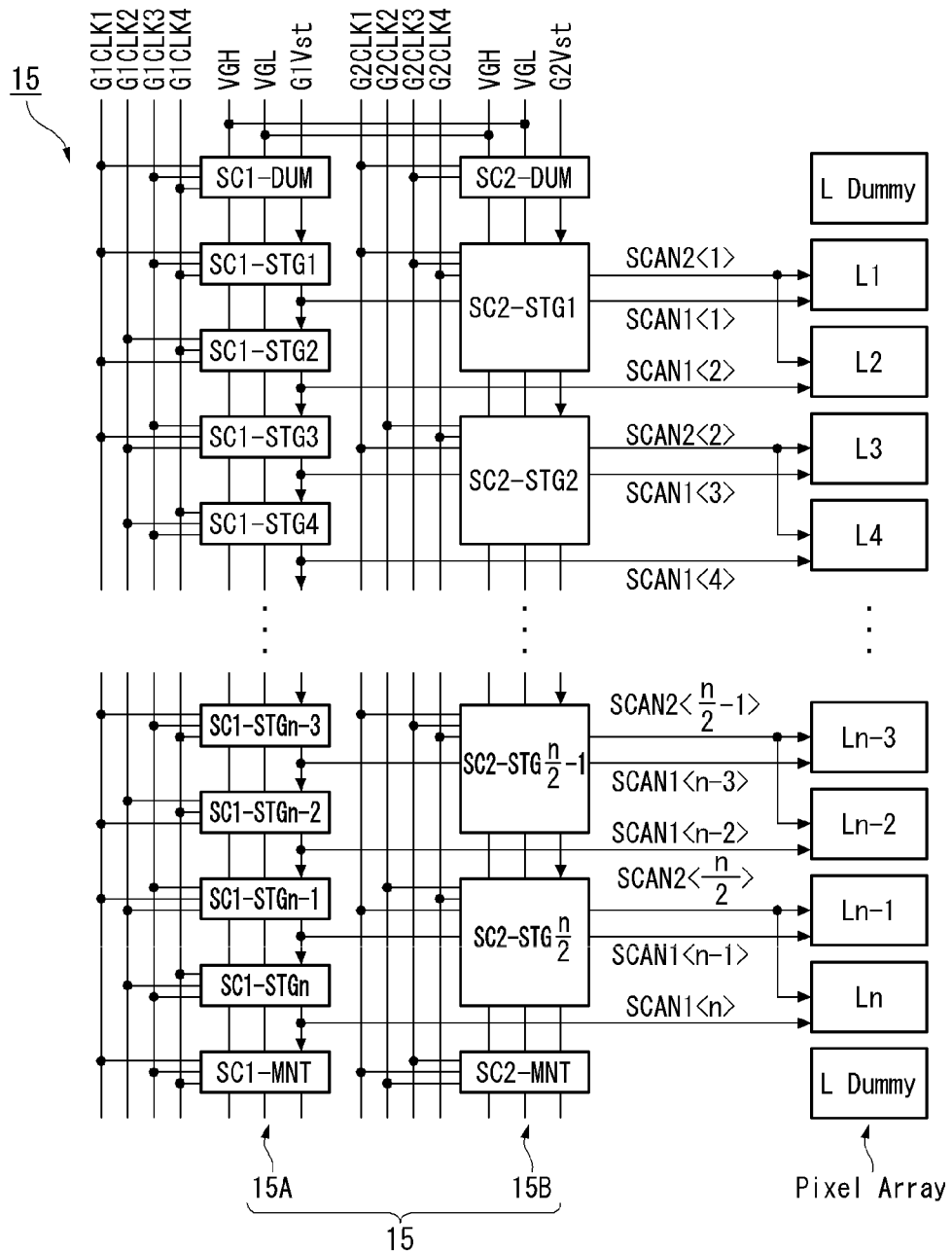
FIG. 13 illustrates an exemplary configuration of a gate driver for driving a pixel array of FIG. 10.

FIG. 13 illustrates an exemplary configuration of a gate driver for driving the pixel array of FIG. 10.

Referring to FIG. 13, another exemplary configuration of the gate driver 15 according to the embodiment of the invention includes a first gate driver circuit 15A for generating a first gate signal SCAN1 to be supplied to the first gate lines 160A and a second gate driver circuit 15B for generating a second gate signal SCAN2 to be supplied to the second gate lines 160B.

More specifically, the gate driver 15 includes the first gate driver circuit 15A having as many stages SC1-STG1 to SC1-STGn as display lines L1 to Ln of the pixel array and the second gate driver circuit 15B having as many stages SC2-STG1 to SC2-STGn/2 as a half of the display lines L1 to Ln of the pixel array, where n is an even number.

The first gate driver circuit 15A generates a first display gate signal SCAN1 and sequentially supplies the first display gate signal SCAN1 to the first gate lines 160A positioned on the display target display lines (i.e., the first gate lines 160A connected to the display target pixels). Further, the first gate driver circuit 15A generates a first sensing gate signal SCAN1 and supplies the first sensing gate signal SCAN1 to the first gate line 160A positioned on at least one sensing target display line (i.e., the first gate line 160A connected to the sensing target pixels).

The stages SC1-STG1 to SC1-STGn constituting the first gate driver circuit 15A may be individually connected to the display lines, respectively. The stages SC1-STG1 to SC1-STGn of the first gate driver circuit 15A sequentially shift a first gate start pulse G1Vst in accordance with a first gate shift clock group including G1CLK1 to G1CLK4 and generate the first display gate signal SCAN1 and the first sensing gate signal SCAN1.

The second gate driver circuit 15B generates a second display gate signal SCAN2 and sequentially supplies the second display gate signal SCAN2 to the second gate lines 160B positioned on the display target display lines (i.e., the second gate lines 160B connected to the display target pixels). Further, the second gate driver circuit 15B generates a second sensing gate signal SCAN2 and supplies the second sensing gate signal SCAN2 to the second gate line 160B positioned on at least one sensing target display line (i.e., the second gate line 160B connected to the sensing target pixels).

Each of the stages SC2-STG1 to SC2-STGn/2 constituting the second gate driver circuit 15B may be commonly connected to the two display lines. The stages SC2-STG1 to SC2-STGn/2 of the second gate driver circuit 15B sequentially shifts a second gate start pulse G2Vst in accordance with a second gate shift clock group including G2CLK1 to G2CLK4 and generate the second display gate signal SCAN2 and the second sensing gate signal SCAN2.

Figure 14:
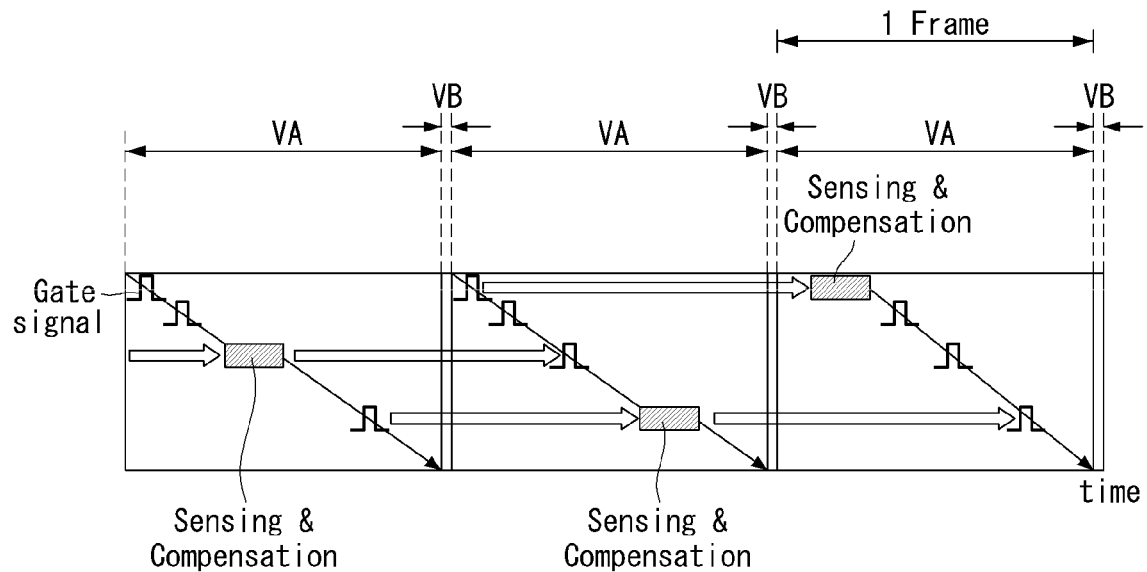
FIGS. 14 and 15 schematically illustrate an external compensation technique according to an embodiment of the invention in which a real-time sensing drive is performed in a vertical active period of a sensing drive frame.
Figure 15:
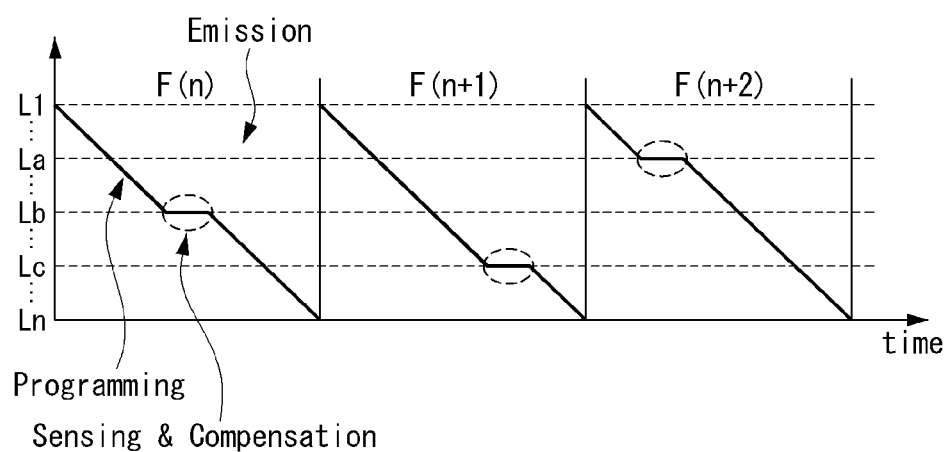

FIGS. 14 and 15 schematically illustrate an external compensation technique according to the embodiment of the invention in which a real-time sensing drive is performed in a vertical active period of a sensing drive frame.

As shown in FIG. 14, when electrical characteristics of the pixel P are sensed through a real-time external compensation method, the embodiment of the invention does not perform a sensing drive operation in a vertical blanking interval VB, and performs the sensing drive together with a display drive in a vertical active period VA of a sensing drive frame. The embodiment of the invention obtains digital sensing data S-DATA through the sensing drive and updates a compensation value based on the digital sensing data S-DATA.

The embodiment of the invention senses at least one display line in each vertical active period VA of a sensing drive frame. When the plurality of display lines is sensed in one vertical active period VA, the plurality of display lines may be sequentially sensed.

The pixels on the sensing target display line do not emit light. Thus, a position of the sensing target display line in each sensing drive frame is previously determined in a non-sequential manner (or randomly), in order to minimize or prevent the sensing target display line from being recognized as a line dim. For example, as shown in FIG. 15, a position of the sensing target display line may be determined as a bth display line Lb in an nth frame Fn, may be determined as a cth display line Lc in a (n+1)th frame F(n+1), and may be determined as an ath display line La in a (n+2)th frame F(n+2). In embodiments disclosed herein, the display line Lc is spatially spaced apart from the display line Lb by several to several hundreds of display lines and is disposed below the display line Lb. Further, the display line La is spatially spaced apart from the display line Lc by several to several hundreds of display lines and is disposed on the display line Lc. However, the embodiments are not limited thereto. The human eye responds more sensitively to sequential changes than non-sequential changes. Thus, when a position of the sensing target display line in each sensing drive frame is determined in the non-sequential manner (or randomly), the sensing target display line can be minimized or prevented from being recognized as the line dim.

Because the embodiment of the invention performs the sensing drive together with the display drive in a vertical active period VA of each sensing drive frame, the embodiment of the invention can easily perform the sensing drive on a desired display line without time constraints. More specifically, when an Nth display line of a display panel having a vertical resolution of N is sensed, a sensing drive of the Nth display line is performed immediately after a display drive of first to (N−1)th display lines is performed. Because an operation of an Nth stage is activated in response to an output signal of a (N−1)th stage, the output signal for the display drive of the (N−1)th stage is used as a carry signal in the sensing drive of the Nth display line. When the sensing drive of the Nth display line is performed in the vertical blanking interval VB, it takes much time to set the sensing drive because first to (N−1)th stages have to be additionally operated before the sensing drive of the Nth display line. However, when the sensing drive is performed together with the display drive in a vertical active period VA of each sensing drive frame as in the embodiment of the invention, the setting time for the sensing drive can be drastically reduced.

An example where both the sensing drive and display drive operations are performed in a vertical active period VA of a sensing drive frame is described below.

Referring to FIG. 15, when the bth display line Lb is determined as the sensing target display line in the nth frame Fn, a display drive (for synchronizing a display gate signal and a display data voltage with each other and applying them to pixels of a corresponding display line to program the corresponding display line and allow the corresponding display line to emit light) is sequentially performed on first to (b−1)th display lines, that are display target display lines. Then, a sensing drive operation (for synchronizing a sensing gate signal and a sensing data voltage with each other and applying them to pixels of a corresponding display line to sense electrical characteristics of the pixels) is performed on the bth display line Lb using an output signal of a (b−1)th stage resulting from the display drive as a carry signal. Subsequently, a display drive operation (for synchronizing a display gate signal and a display data voltage with each other and applying them to pixels of a corresponding display line to program the corresponding display line and allow the corresponding display line to emit light) is sequentially performed on (b+1)th to nth (i.e., last) display lines based on an output signal of a bth stage resulting from the sensing drive operation.

Further, referring to FIG. 15, when the cth display line Lc is determined as the sensing target display line in the (n+1)th frame F(n+1), a display drive is sequentially performed on first to (c−1)th display lines that are display target display lines, and then a sensing drive operation is performed on the cth display line Lc in response to an output signal of a (c−1)th stage resulting from the display drive operation. Subsequently, a display drive operation is sequentially performed on (c+1)th to nth (i.e., last) display lines based on an output signal of a cth stage resulting from the sensing drive operation.

Further, referring to FIG. 15, when the ath display line La is determined as the sensing target display line in the (n+2)th frame F(n+2), a display drive operation is sequentially performed on first to (a−1)th display lines that are display target display lines, and then a sensing drive operation is performed on the ath display line La in response to an output signal of a (a−1)th stage resulting from the display drive. Subsequently, a display drive is sequentially performed on (a+1)th to nth (i.e., last) display lines based on an output signal of an ath stage resulting from the sensing drive.

Figure 16:
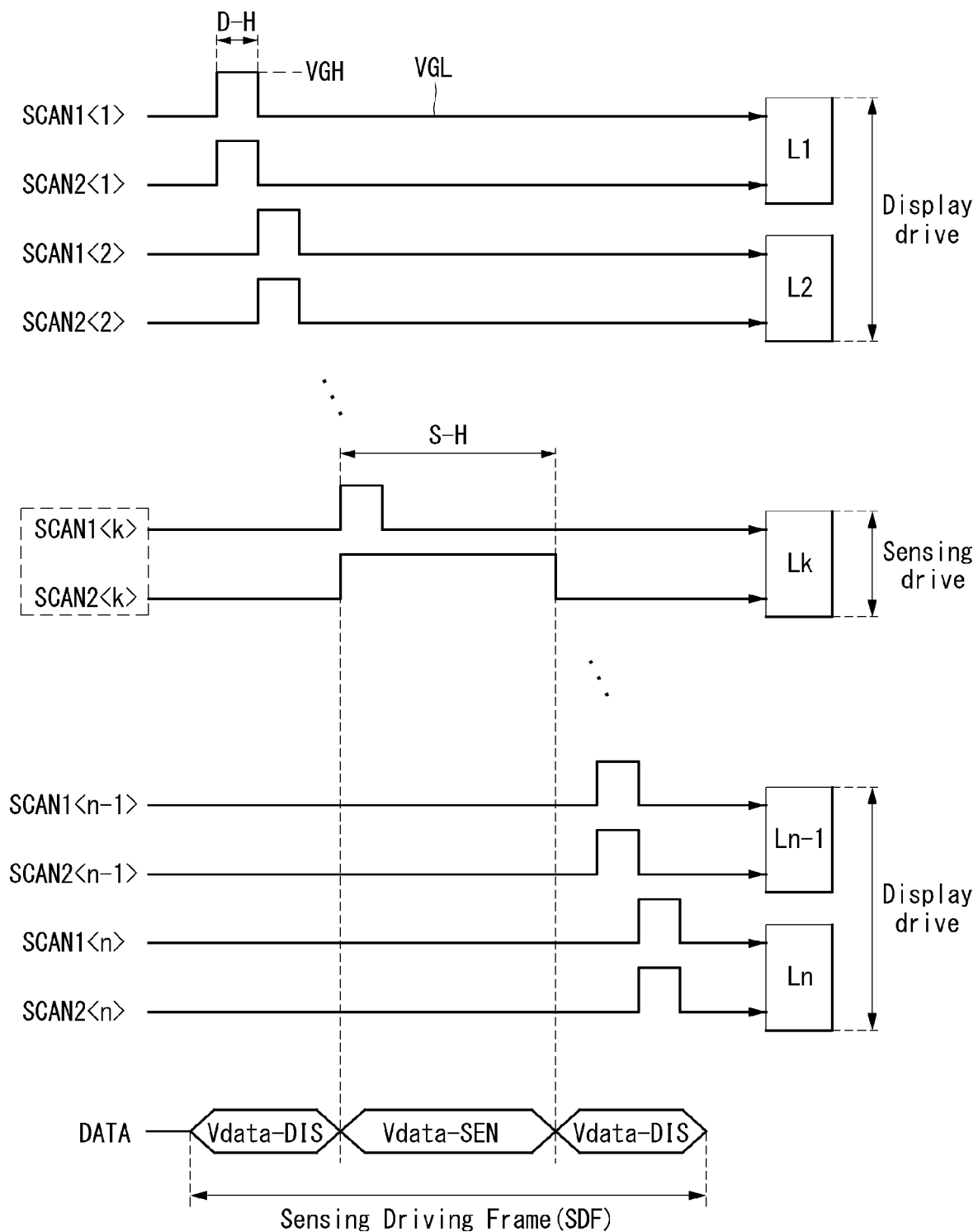
FIGS. 16 and 17 are exemplary waveform diagrams of first and second gate signals generated in a gate driver of FIGS. 12 and 13.

FIG. 16 is an exemplary waveform diagram of first and second gate signals generated in the gate driver of FIG. 12.

Referring to FIG. 16, when a kth display line Lk is determined as the sensing target display line, first to (k−1)th display lines L1 to L(k−1) disposed above the kth display line Lk are sequentially display-driven, and then the kth display line Lk is sensing-driven. Subsequently, (k+1)th to nth display lines L(k+1) to Ln disposed below the kth display line Lk are sequentially display-driven.

In order to perform the sensing drive operation, a kth first gate signal SCAN1<k> for the sensing drive is supplied to a first gate line 160A connected to the kth display line Lk, and a kth second gate signal SCAN2<k> for the sensing drive operation is supplied to a second gate line 160B connected to the kth display line Lk. A period of a gate high voltage VGH of the kth first gate signal SCAN1<k> for the sensing drive operation and a period S-H of a gate high voltage VGH of the kth second gate signal SCAN2<k> for the sensing drive operation are synchronized with a supply timing of a sensing data voltage Vdata-SEN. For the sensing drive, the period S-H of the gate high voltage VGH of the kth second gate signal SCAN2<k> for the sensing drive operation may be wider than the period of the gate high voltage VGH of the kth first gate signal SCAN1<k> for the sensing drive operation. A sensing time is determined depending on the period S-H of the gate high voltage VGH of the kth second gate signal SCAN2<k> for the sensing drive. As the sensing time increases, the accuracy of the sensing is improved. However, a length of a display period has to decrease, in order to secure the sufficient sensing time in a vertical active period of a sensing drive frame.

In a first pixel P1 included in the kth display line Lk, a first switching TFT ST1 is turned on in response to the kth first sensing gate signal SCAN1<k> of the gate high voltage VGH, and a second switching TFT ST2 is turned on in response to the kth second sensing gate signal SCAN2<k> of the gate high voltage VGH. A pixel current in accordance with the sensing data voltage Vdata-SEN flows in the first pixel P1 and is charged to the sensing line 150 through the second switching TFT ST2. The sensor 22 senses a voltage charged to the sensing line 150 and can detect electrical characteristics of the first pixel P1.

In order to perform the display drive operation, first gate signals SCAN1<1> to SCAN1<k−1> and SCAN1<k+1> to SCAN1<n> for the display drive operation are sequentially supplied to first gate lines 160A of the first to (k−1)th display lines L1 to L(k−1) and the (k+1)th to nth display lines L(k+1) to Ln. Periods D-H of gate high voltages VGH of the first display gate signals SCAN1<1> to SCAN1<k−1> and SCAN1<k+1> to SCAN1<n> and periods of gate high voltages VGH of the second display gate signals SCAN2<1> to SCAN2<k−1> and SCAN2<k+1> to SCAN2<n> are synchronized with a supply timing of the display data voltage Vdata-DIS. As shown in FIG. 16, each length of the periods D-H of the gate high voltages VGH of the first display gate signals SCAN1<1> to SCAN1<k−1> and SCAN1<k+1> to SCAN1<n> may be the same as each length of the periods of the gate high voltages VGH of the second display gate signals SCAN2<1> to SCAN2<k−1> and SCAN2<k+1> to SCAN2<n>.

Figure 17:
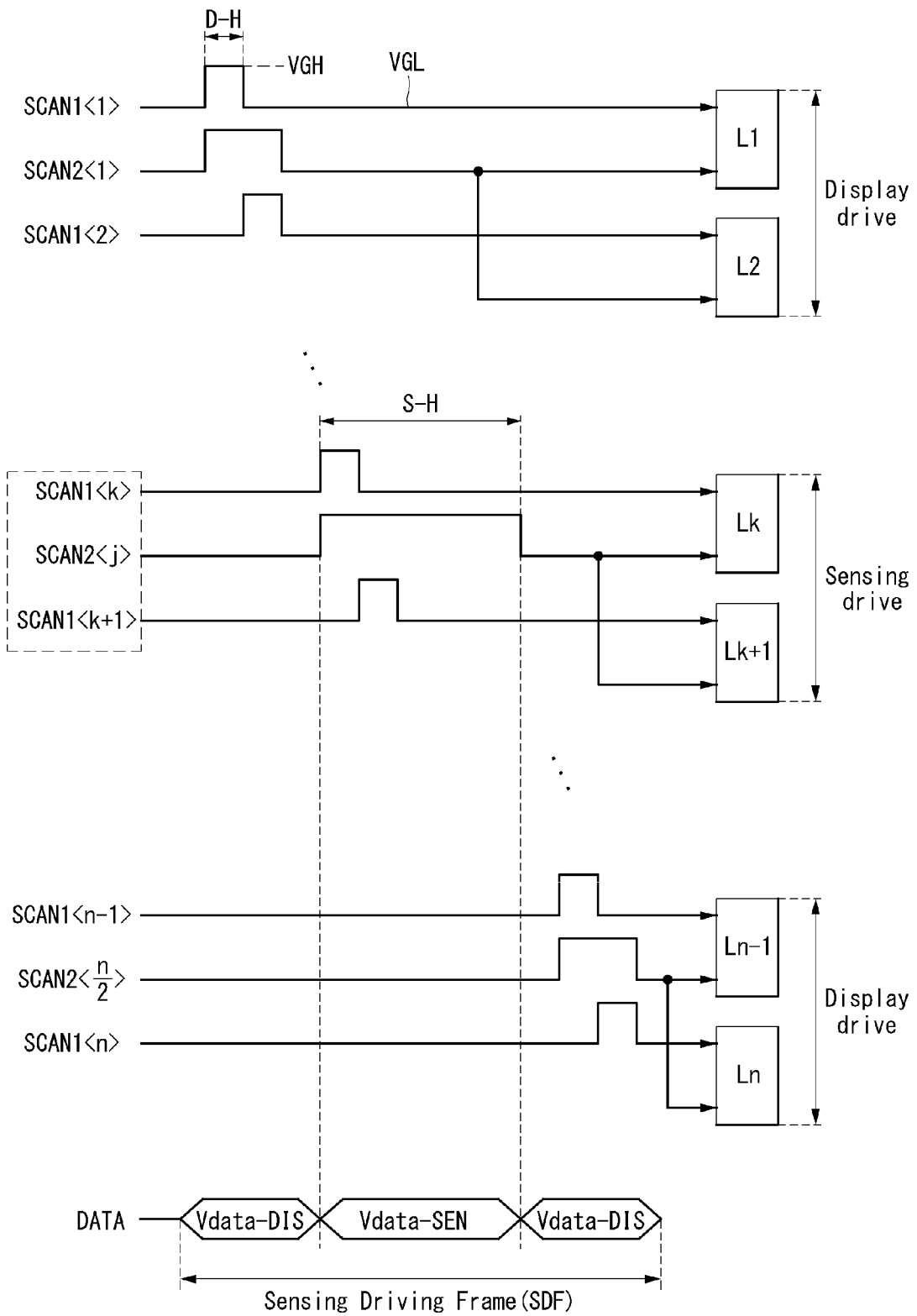

FIG. 17 is an exemplary waveform diagram of first and second gate signals generated in the gate driver of FIG. 13.

Referring to FIG. 17, when a kth display line Lk and a (k+1)th display line L(k+1) are determined as the sensing target display line, first to (k−1)th display lines L1 to L(k−1) disposed above the kth display line Lk are sequentially display-driven, and then the kth display line Lk and the (k+1)th display line L(k+1) are sequentially sensing-driven. Subsequently, (k+2)th to nth display lines L(k+2) to Ln disposed below the (k+1)th display line L(k+1) are sequentially display-driven.

In order to perform the sensing drive operation, a kth first gate signal SCAN1<k> for the sensing drive is supplied to a first gate line 160A connected to the kth display line Lk, and a jth second gate signal SCAN2<j> for the sensing drive operation is supplied to a second gate line 160B connected to the kth display line Lk, where j is a positive integer less than k. Further, a (k+1)th first gate signal SCAN1<k+1> for the sensing drive operation is supplied to a first gate line 160A connected to the (k+1)th display line L(k+1), and the jth second gate signal SCAN2<j> for the sensing drive operation is supplied to a second gate line 160B connected to the (k+1)th display line L(k+1).

Periods of gate high voltages VGH of the first sensing gate signals SCAN1<k> and SCAN1<k+1> and a period S-H of a gate high voltage VGH of the jth second sensing gate signal SCAN2<j> are synchronized with a supply timing of a sensing data voltage Vdata-SEN. For the sensing drive operation, the period S-H of the gate high voltage VGH of the jth second sensing gate signal SCAN2<j> may be wider (i.e. longer) than the periods of the gate high voltages VGH of the first sensing gate signals SCAN1<k> and SCAN1<k+1>. A sensing time is determined depending on the period S-H of the gate high voltage VGH of the jth second sensing gate signal SCAN2<j>. As the sensing time increases, the accuracy of the sensing is improved. However, a length of a display period has to decrease or be reduced, in order to secure sufficient sensing time in a vertical active period of a sensing drive frame.

In a first pixel P1 included in the kth display line Lk, a first switching TFT ST1 is turned on in response to the kth first sensing gate signal SCAN1<k> of the gate high voltage VGH, and a second switching TFT ST2 is turned on in response to the kth second sensing gate signal SCAN2<k> of the gate high voltage VGH. A pixel current in accordance with the sensing data voltage Vdata-SEN flows in the first pixel P1 and is charged to the sensing line 150 through the second switching TFT ST2. The sensor 22 senses a voltage charged to the sensing line 150 and can detect electrical characteristics of the first pixel P1.

In order to perform the display drive operation, first gate signals SCAN1<1> to SCAN1<k−1> and SCAN1<k+2> to SCAN1<n> for the display drive are sequentially supplied to first gate lines 160A of the first to (k−1)th display lines L1 to L(k−1) and the (k+2)th to nth display lines L(k+2) to Ln. Periods D-H of gate high voltages VGH of the first display gate signals SCAN1<1> to SCAN1<k−1> and SCAN1<k+2> to SCAN1<n> and periods of gate high voltages VGH of the second display gate signals SCAN2<1> to SCAN2<j−1> and SCAN2<j+1> to SCAN2<n/2> are synchronized with a supply timing of a display data voltage Vdata-DIS. As shown in FIG. 17, each length of the periods D-H of the gate high voltages VGH of the first display gate signals SCAN1<1> to SCAN1<k−1> and SCAN1<k+2> to SCAN1<n> may be different from each length of the periods of the gate high voltages VGH of the second display gate signals SCAN2<1> to SCAN2<j−1> and SCAN2<j+1> to SCAN2<n/2>.

Figure 18:
FIG. 18 illustrates a normal drive frame and a sensing drive frame allocated to a particular period of time.
Figure 19A:
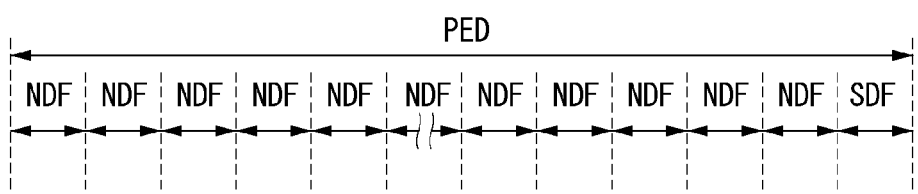
FIGS. 19A and 19B illustrate examples where a normal drive frame and a sensing drive frame are allocated to a particular period of time.
Figure 19B:
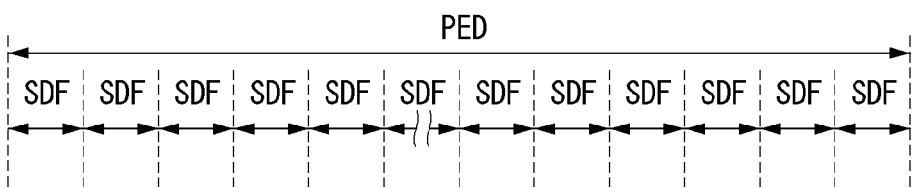

FIG. 18 illustrates a normal drive frame and a sensing drive frame allocated to a particular period of time. FIGS. 19A and 19B illustrate examples where a normal drive frame and a sensing drive frame are allocated to a particular period of time.

Referring to FIG. 18, A normal drive frames NDF and B sensing drive frames SDF may be included in a particular period of time PED, where A≥0 and B≥1. In other words, when the display panel 10 is driven at a frame frequency of N Hz so that N frames are allocated for one second, where N is a positive integer, the number of sensing drive frames SDF included in one second may be 1 to N. For example, when the frame frequency is 60 Hz, 60 frames may be allocated to one second, and the number of sensing drive frames SDF may be 1 to 60. For example, as shown in FIG. 19A, when the number of sensing drive frames SDF is one, the remaining 59 frames are normal drive frames NDF. Further, when the number of sensing drive frames SDF is 20, the remaining 40 frames are normal drive frames NDF. As shown in FIG. 19B, when all the 60 frames are allocated as the sensing drive frames SDF, there is no normal drive frame NDF.

As the number of sensing drive frames SDF included in the particular period of time PED increases, a sensing cycle is shortened. As a result, it is advantageous to improve the image quality because electrical characteristics of the pixels can be rapidly compensated. However, in this instance, power consumption can be increased due to the frequent sensing and compensation operations. Thus, the number of sensing drive frames SDF may be appropriately determined depending on the models and the specifications of the display panel and/or the display environment or product use application in consideration of the image quality and the power consumption.

Figure 20:
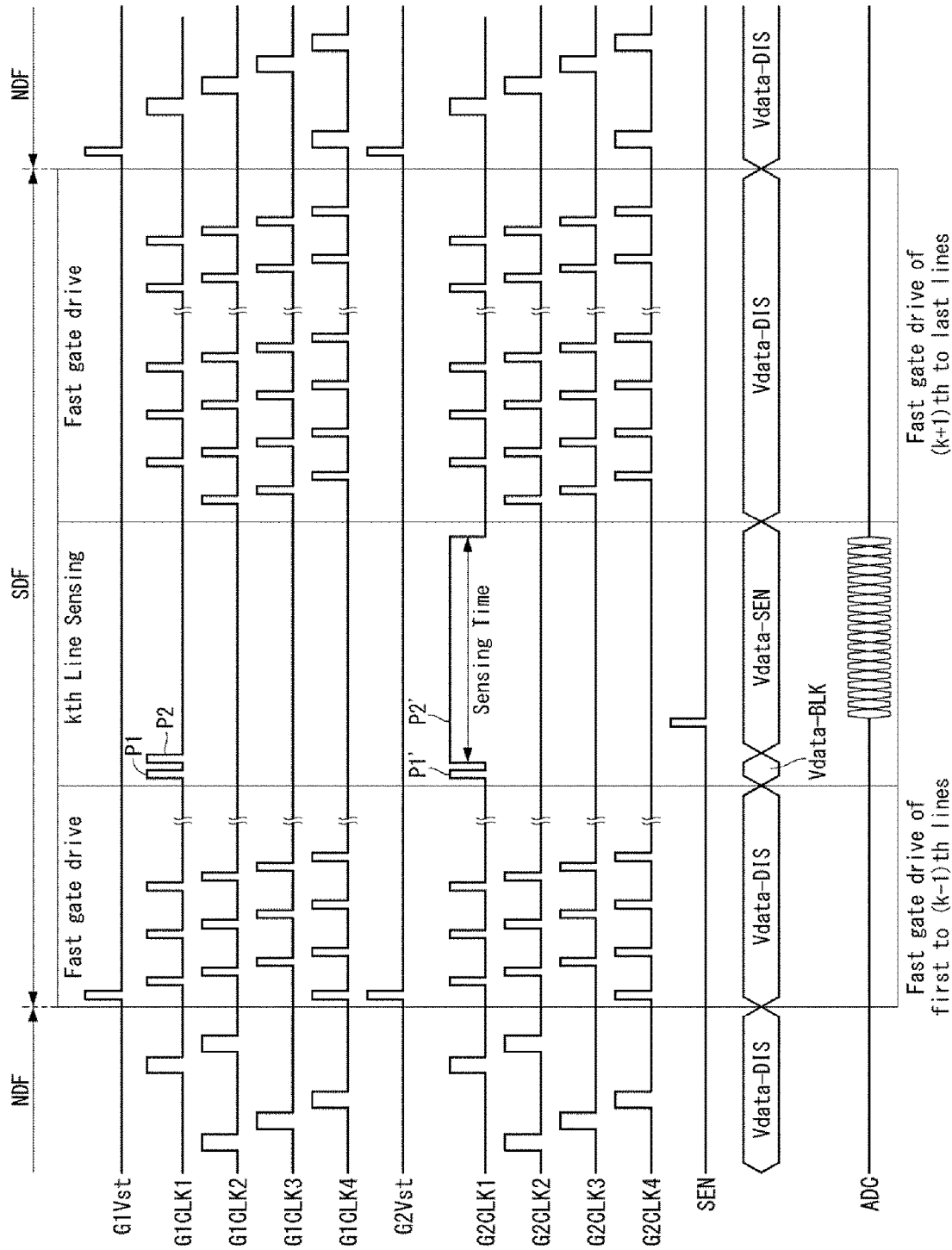
FIG. 20 illustrates an example of modifying a gate timing control signal to be input to a gate driver of FIG. 12 in order to secure a sensing time.
Figure 21:
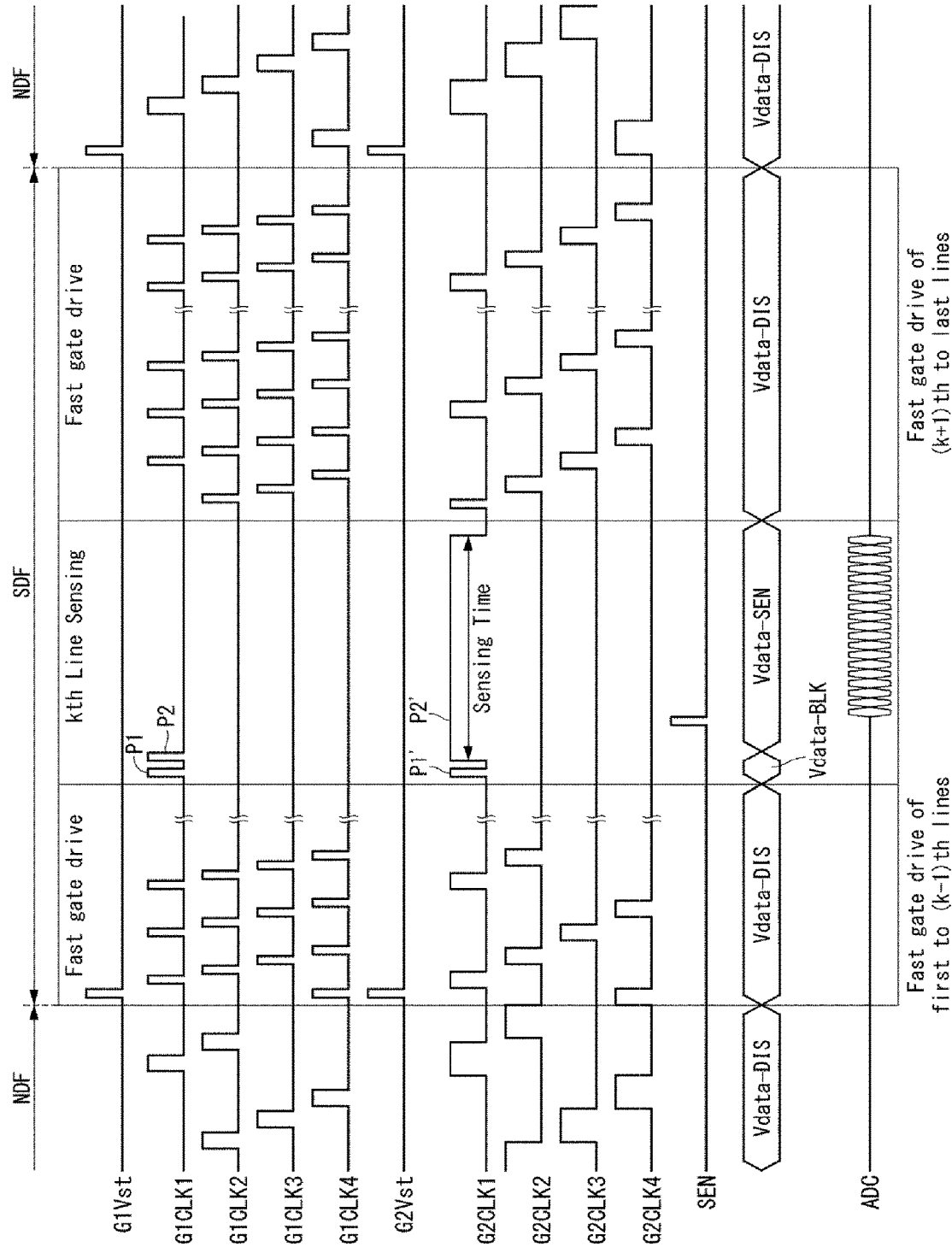
FIG. 21 illustrates an example of modifying a gate timing control signal to be input to a gate driver of FIG. 13 in order to secure a sensing time.

FIG. 20 illustrates an example of modifying a gate timing control signal to be input to the gate driver of FIG. 12 in order to secure a sensing time. FIG. 21 illustrates an example of modifying a gate timing control signal to be input to the gate driver of FIG. 13 in order to secure a sensing time.

Referring to FIGS. 20 and 21, the embodiment of the invention can secure a sufficient sensing time by shortening a display period in a vertical active period of a sensing drive frame SDF. To this end, the timing controller 21 changes a clock cycle of a gate timing control signal depending on particular arrangement order of sensing drive frames SDF and normal drive frames NDF that are allocated to a particular period of time. The timing controller 21 may cause a clock cycle of the gate timing control signal in the sensing drive frame SDF to be shorter than a clock cycle of the gate timing control signal in the normal drive frame NDF. More specifically, the timing controller 21 may cause a clock cycle of the gate timing control signal corresponding to a display period of the sensing drive frame SDF to be shorter than a clock cycle of the gate timing control signal in the normal drive frame NDF.

The timing controller 21 may decrease a pulse width of a clock while decreasing the clock cycle of the gate timing control signal corresponding to the display period of the sensing drive frame SDF. When the pulse width of the clock of the gate timing control signal decreases, a pulse width of the gate signal applied to the pixels decreases. A period, in which the pixel is charged with the display data voltage, is determined depending on the pulse width of the gate signal. However, when the pulse width of the gate signal excessively decreases, a charging time of the display data voltage may be insufficient. Therefore, the clock cycle and the pulse clock width of the gate timing control signal may be determined within a range not causing a problem of light emission. The timing controller 21 may cause a clock cycle of a first gate timing control signal in the sensing drive frame SDF to be shorter than a clock cycle of a second gate timing control signal in the normal drive frame NDF.

The first gate timing control signal may include a first gate shift clock group G1CLK1 to G1CLK4 applied to the first gate driver circuit 15A and a second gate shift clock group G2CLK1 to G2CLK4 applied to the second gate driver circuit 15B during the sensing drive frame SDF. However, the embodiments are not limited thereto.

The second gate timing control signal may include a first gate shift clock group G1CLK1 to G1CLK4 applied to the first gate driver circuit 15A and a second gate shift clock group G2CLK1 to G2CLK4 applied to the second gate driver circuit 15B during the normal drive frame NDF. However, the embodiments are not limited thereto.

In other words, the timing controller 21 further decreases a clock cycle of each of the first and second gate shift clock groups G1CLK1 to G1CLK4 and G2CLK1 to G2CLK4 in the sensing drive frame SDF than the normal drive frame NDF. As shown in FIG. 20, when a sensing gate shift clock, which is a basis for generating the sensing gate signal applied to a kth display line, is set as G1CLK1 and G2CLK1, the sensing time is determined depending on a pulse width of the sensing gate shift clock G2CLK1 (specifically, a pulse width of a pulse P2'). Because the sensing gate shift clock is not necessary in the normal drive frame NDF and only a display gate shift clock is applied in the normal drive frame NDF, the clock cycles of the first and second gate shift clock groups G1CLK1 to G1CLK4 and G2CLK1 to G2CLK4 do not need to decrease in the normal drive frame NDF. However, the sensing gate shift clock can be applied for a sufficient time in the sensing drive frame SDF by decreasing a clock cycle of a portion (corresponding to the display gate shift clock) of the first and second gate shift clock groups G1CLK1 to G1CLK4 and G2CLK1 to G2CLK4 in the sensing drive frame SDF.

Assuming that the kth display line is sensed in the vertical active period of the sensing drive frame SDF, first to (k−1)th stages of the gate driver are driven rapidly in response to the first gate timing control signal in the display period of the sensing drive frame SDF, and then a kth stage is driven in the sensing period of the sensing drive frame SDF. Subsequently, (k+1)th to nth stages of the gate driver are driven rapidly in response to the first gate timing control signal in another display period of the sensing drive frame SDF. As a result, the sensing gate shift clock that generates the sensing pulse can be wider than the clock pulses during the normal drive frames.

On the other hand, in the normal drive frame NDF, the first to nth stages of the gate driver are driven in response to the second gate timing control signal relatively slower than the remaining stages, other than the kth stage, that are operated in the sensing drive frame SDF.

The timing controller 21 may output the sensing gate shift clocks G1CLK1 and G2CLK1 so that a first pulse (P1/P1') (e.g., an initialization pulse) and a second pulse (P2/P2') (e.g., a sensing pulse) are successively arranged during the vertical active period of the sensing drive frame SDF. In the embodiments disclosed herein, the first pulse (P1/P1') is used to cause the data voltage generator 23 to apply an initialization data voltage to the target lines to initialize the sensing target display line to a predefined voltage. For example, the first pulse (P1/P1') may cause the data voltage generator 23 to apply a black gray data voltage Vdata-BLK to the pixel, and the second pulse (P2/P2') is used to apply the sensing data voltage Vdata-SEN to the pixel. The black gray data voltage may be a voltage of a particular gray data.

The data voltage generator 23 may apply the black gray data voltage Vdata-BLK to the pixels on the sensing target display line of the display panel 10 in synchronization with the sensing gate shift clocks G1CLK1 and G2CLK1 of the first pulse (P1/P1'), thereby initializing the pixels. When the pixels are initialized with the black gray data voltage Vdata-BLK, a gate potential of the driving element is uniformly held at a black gray level.

Subsequently, the data voltage generator 23 may apply the sensing data voltage Vdata-SEN to the pixels on the sensing target display line of the display panel 10 in synchronization with the sensing gate shift clocks G1CLK1 and G2CLK1 of the second pulse (P2/P2'). When the sensing data voltage Vdata-SEN is applied to the pixels in a state the pixels are initialized at the black gray level, the gate potential of the driving element may be accurately set to the sensing data voltage Vdata-SEN. A sensing time may be determined as a high level period of the second pulse P2'. In other words, the sensing drive is performed in response to a sampling signal SEN in the high level period of the second pulse P2', and the ADC outputs a sensing result as digital sensing data. FIGS. 20 and 21 illustrate that the first pulse (P1/P1') used to apply the black gray data voltage Vdata-BLK to the pixel is arranged prior to the sensing time. However, the embodiments are not limited thereto. For example, the first pulse (P1/P1') may be arranged after the sensing time.

As described above, various embodiments of the invention can easily perform the sensing drive on a desired display line without time constraints by performing the sensing drive together with the display drive in the vertical active period of the sensing drive frame.

Further, various embodiments of the invention can secure a sufficient sensing time and improve the accuracy of the sensing by further decreasing a clock cycle of the gate timing control signal in the sensing drive frame than the normal drive frame.

Further, various embodiments of the invention can previously prevent the sensing target display line from being recognized as line dim by setting in the non-sequential manner (or randomly) a position of the sensing target display line in the adjacent sensing drive frames.

Although various embodiments have been described with reference to a number of illustrative embodiments thereof, numerous other modifications and embodiments may be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a display panel including a plurality of display lines that each comprise a row of pixels, the display panel further including a plurality of gate lines and a plurality of data lines, wherein the display panel is operable to generate a sequence of frames including a normal drive frame and a sensing drive frame, wherein the normal drive frame includes a vertical active period of the normal drive frame, and wherein during the vertical active period of the normal drive frame, the display lines are driven with data signals from the data lines according to the timing of display gate pulses from the gate lines to display the image data, wherein the sensing drive frame includes a vertical active period of the sensing drive frame, wherein the vertical active period of the sensing drive frame includes a display period and a sensing period, wherein electrical characteristics of a sensing target display line of the display panel are sensed during the sensing period, wherein the data lines are driven with the data signals without sensing the display lines during the display period, and wherein respective vertical blanking intervals occur after the vertical active period of the normal drive frame and after the vertical active period of the sensing drive frame, wherein the display gate pulses for enabling driving of display lines by the data signals are not provided on the gate lines during the respective vertical blanking intervals; and
a timing controller to supply timing signals to a gate driver as a plurality of display clock pulses to control timing of the gate driver providing the display gate pulses to the gate lines, the display clock pulses having a first timing during the vertical active period of the sensing drive frame and the display clock pulses having a second timing during the vertical active period of the normal drive frame, the second timing different than the first timing, and wherein the display clock pulses during the sensing drive frame are shorter than the display clock pulses during the normal drive frame.

2. The display device of claim 1, wherein the gate driver comprises:
a first gate driver circuit to supply first gate signals to first gate lines of the plurality of gate lines; and a second gate driver circuit to supply second gate signals to second gate lines of the plurality of gate lines;
wherein each of the first gate lines and each of the second gate lines are coupled to one of the display lines respectively.

3. The display device of claim 1, wherein the gate driver comprises:
a first gate driver circuit to supply first gate signals to first gate lines of the plurality of gate lines; and
a second gate driver circuit to supply second gate signals to second gate lines of the plurality of gate lines;
wherein each of the first gate lines are coupled to only one of the display lines, and wherein each of the second gate lines are coupled to at least two display lines.

4. The display device of claim 1, wherein the timing controller further provides a sensing clock pulse to the gate driver to cause the gate driver to select the sensing target display lines for sensing during the sensing period, the sensing clock pulse wider than the display clock pulses during the normal drive frame.

5. The display device of claim 4, wherein the timing controller further provides an initialization clock pulse to the gate driver to cause the gate driver to select the sensing target display line and a data driver applies an initialization data voltage to the sensing target display line during the sensing period to initialize the target display line to a specific voltage.

6. The display device of claim 1, wherein a length of the sensing drive frames are equal to a length of the normal drive frames.

7. The display device of claim 1, further comprising:
a sensing circuit to receive the electrical characteristics of the sensing target display line during the sensing period of the sensing drive frame; and
a compensator circuit to compensate for differences in the sensed electrical characteristics.

8. The display device of claim 1, wherein the timing controller allocates A normal drive frames and B sensing drive frames to a predetermined period of time depending on a frame frequency, where $A \geq 0$ and $B \geq 1$.

9. The display device of claim 8, wherein when the display panel is driven at a frame frequency of N Hz so that N frames are allocated for one second, where N is a positive integer, and a number of sensing drive frames included in one second is in the range 1 to N.

10. The display device of claim 1, wherein the electrical characteristics include at least one of: a voltage, a current, a threshold voltage, and an electron mobility.

11. A display device comprising:
a display panel including a plurality of display lines that each comprise a row of pixels, the display panel further including a plurality of gate lines and a plurality of data lines, the display lines, wherein the display panel is operable to drive the display of the image data based on timing of display gate pulses during a sequence of frames including at least a sensing drive frame, wherein the sensing drive frame includes a vertical active period, where the vertical active period of the sensing drive frame includes a display period and a sensing period, wherein electrical characteristics of sensing target display line of the display panel are sensed during the sensing period of the vertical active period of the sensing drive frame, wherein the data lines are driven with the data signals without sensing the display lines during the display period of the vertical active period of the sensing drive frame, and wherein a vertical blanking interval occurs after the vertical active period of the sensing drive frame, wherein the display gate pulses for enabling driving of display lines by the data signals are not provided on the gate lines during the respective vertical blanking intervals; and
a timing controller to supply a plurality of display clock pulses to a gate driver that cause the gate driver to sequentially select different ones of the display lines for receiving the data signals during the display period of the vertical active period of the sensing drive frame and to select a sensing target display line for sensing of the electrical characteristics during the sensing period of the vertical active period of the sensing drive frame.

12. The display device of claim 11, wherein the timing controller further causes the gate driver to select non-adjacent sensing target display lines in consecutive sensing drive frames.

13. The display device of claim 11, further comprising the gate driver, wherein the gate driver comprises:
a first gate driver circuit to supply first gate signals to first gate lines of the plurality of gate lines; and
a second gate driver circuit to supply second gate signals to second gate lines of the plurality of gate lines;
wherein each of the first gate lines and each of the second gate lines are coupled to one of the display lines respectively.

14. The display device of claim 11, further comprising the gate driver, wherein the gate driver comprises:
a first gate driver circuit to supply first gate signals to first gate lines of the plurality of gate lines; and
a second gate driver circuit to supply second gate signals to second gate lines of the plurality of gate lines;
wherein each of the first gate lines are coupled to only one of the display lines, and wherein each of the second gate lines are coupled to at least two display lines.

15. The display device of claim 11, wherein the timing controller provides a sensing clock pulse to the gate driver to cause the gate driver to select the sensing target display lines during the sensing period, the sensing clock pulse wider than the display clock pulses during the display period.

16. The display device of claim 15, wherein the timing controller provides an initialization clock pulse to the gate driver to cause the gate driver to select the sensing target display line and the data driver applies an initialization data voltage to the sensing target display line during the sensing period to initialize the sensing target display line to a specific voltage.

17. The display device of claim 11, further comprising:
a sensing circuit to receive the electrical characteristics of the sensing target display line during the sensing period of the sensing drive frame; and
a compensator circuit to compensate for differences in the sensed electrical characteristics.

18. A controller for a display panel having a plurality of display lines that each comprise a row of pixels, a plurality of gate lines, and a plurality of data lines, the controller comprising:
a timing controller to control timing of a sequence of frames, the sequence of frames including a sensing drive frame and a normal drive frame, to control timing of a vertical active of the sensing drive frame and a vertical active period of the normal drive frame, to control timing of respective vertical blanking intervals occurring after the vertical active period of the sensing drive frame and after the vertical active period of the normal drive frame, to control timing of a sensing period and a display period within the vertical active period of the sensing drive frame, and to supply timing signals to a gate driver as a plurality of display clock pulses to control timing of the gate driver providing display gate pulses to the gate lines, the display clock pulses having a first timing during the vertical active period of the sensing drive frame and the display clock pulses having a second timing during the vertical active period of the normal drive frame, wherein the second timing is different than the first timing, wherein the display clock pulses during the sensing drive frame are shorter than the display clock pulses during the normal drive frame, and wherein the display lines are driven with data signals from the data lines according to timing of the display gate pulses from the gate lines to display image data during the vertical active periods and the display gate pulses for enabling driving of display lines by the data signals not provided on the gate lines during the respective vertical blanking intervals during the vertical blanking intervals, wherein electrical characteristics of a sensing target display line of the display panel are sensed during the sensing period, and wherein the data lines are driven with the data signals without sensing the display lines during the vertical active period of the normal drive frame and during the display period of the vertical active period of the sensing drive frame; and a sensing circuit to receive the electrical characteristics of the sensing target display line during the vertical active of the sensing drive frame.

19. The controller of claim 18, wherein the timing controller further provides a sensing clock pulse to the gate driver to cause the gate driver to select the sensing target display line for sensing during the sensing period, the sensing clock pulse wider than the clock pulses during the normal drive frame.

20. The controller of claim 19, wherein the timing controller provides an initialization clock pulse to the gate driver to cause the gate driver to select the sensing target display line and a data driver applies an initialization data voltage to the sensing target display line during the sensing period to initialize the target display line to a specific voltage.

* * * * *